(12) United States Patent
Kawa et al.

(10) Patent No.: US 8,561,003 B2
(45) Date of Patent: Oct. 15, 2013

(54) N-CHANNEL AND P-CHANNEL FINFET CELL ARCHITECTURE WITH INTER-BLOCK INSULATOR

(75) Inventors: Jamil Kawa, Campbell, CA (US);
Victor Moroz, Saratoga, CA (US);
Deepak Sherlekar, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 115 days.

(21) Appl. No.: 13/194,835

(22) Filed: Jul. 29, 2011

(65) Prior Publication Data
US 2013/0026571 A1    Jan. 31, 2013

(51) Int. Cl.
*G06F 17/50* (2006.01)
(52) U.S. Cl.
USPC ........... 716/132; 716/118; 716/119; 716/126; 716/139; 438/129; 438/559
(58) Field of Classification Search
USPC .......... 716/118–119, 126, 132, 139; 438/129, 438/559
See application file for complete search history.

(56) References Cited

U.S. PATENT DOCUMENTS

| | | | | |
|---|---|---|---|---|
| 7,737,501 B2 * | 6/2010 | Zhu et al. | ....................... | 257/365 |
| 7,862,962 B2 | 1/2011 | Shieh et al. | | |
| 8,212,295 B2 * | 7/2012 | Liaw | ............................. | 257/288 |
| 2008/0283925 A1 | 11/2008 | Berthold et al. | | |
| 2009/0101940 A1 * | 4/2009 | Barrows et al. | ................ | 257/204 |
| 2010/0015778 A1 | 1/2010 | Lin et al. | | |
| 2011/0095372 A1 | 4/2011 | Yuan et al. | | |

OTHER PUBLICATIONS

Hisamoto D., et al., "A Folded-channel MOSFET for Deep sub-tenth Micron Era", IEEE International Electron Device Meeting Technical Digest, pp. 1032-1034 (1998).
Lindert N. et al., "Sub-60-nm Quasi-Planar FinFETs Fabricated Using a Simplified Process," IEEE Electron Device Letters, 22(10), 2001, pp. 487-489.
Cho H.J. et al., "Fin Width Scaling Criteria of Body-Tied FinFET in Sub-50 nm Regime," 62nd Device Research Conference Digest vol. 1, pp. 209-210 (2004).
International Search Report and Written Opinion from family member application PCT/US2012/047829 mailed Jan. 30, 2013, 8 pages.

* cited by examiner

*Primary Examiner* — Nghia Doan
(74) *Attorney, Agent, or Firm* — Haynes Beffel & Wolfeld LLP

(57) ABSTRACT

A finFET block architecture includes a first set of semiconductor fins having a first conductivity type, and a second set of semiconductor fins having a second conductivity type. An inter-block insulator is placed between outer fins of the first and second sets. A patterned gate conductor layer includes a first plurality of gate traces extending across the set of fins in the first block without crossing the inter-block insulator, and a second plurality of gate traces extending across the set of fins in the second block without crossing the inter-block insulator. Patterned conductor layers over the gate conductor layer are arranged in orthogonal layout patterns, and include an inter-block connector arranged to connect gate traces in the first and second blocks.

37 Claims, 14 Drawing Sheets

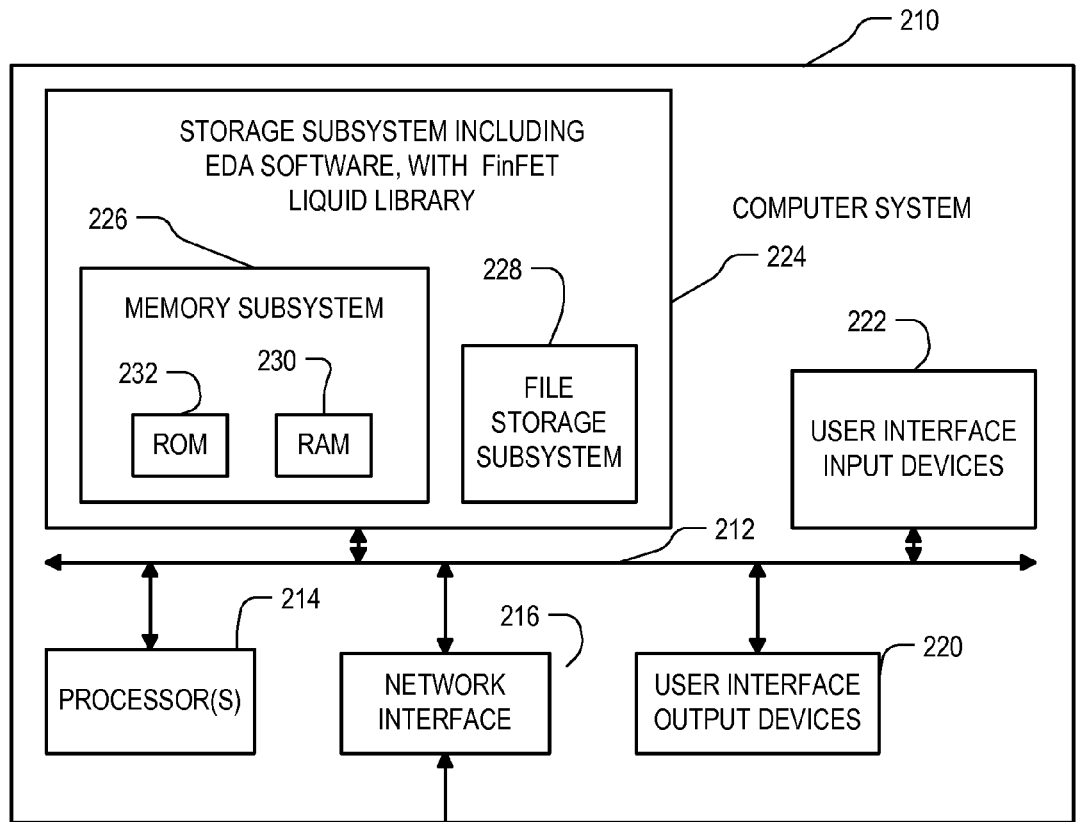
FIG. 2A
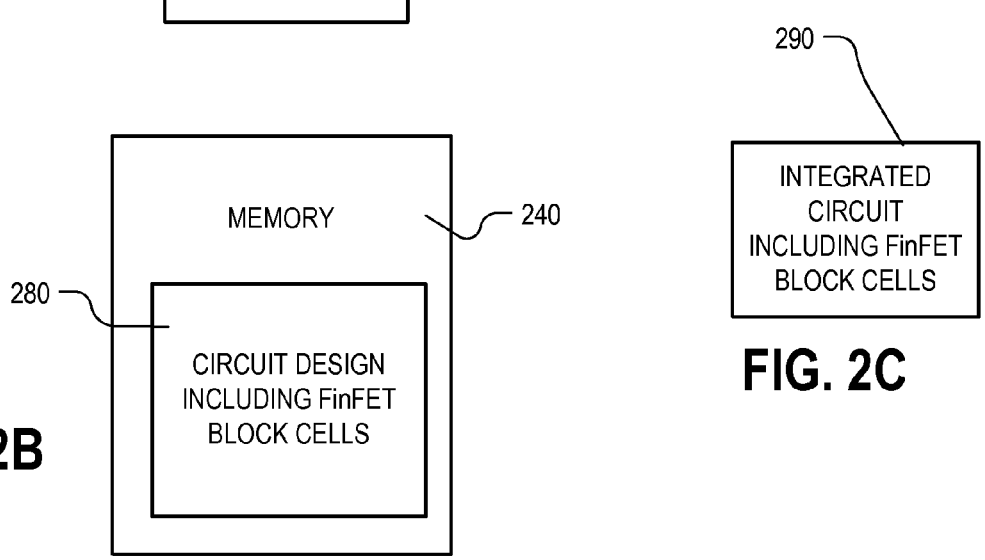
FIG. 2B
FIG. 2C

D- FF INPUT STAGE

8T CLOCK BUFFER

N-CHANNEL AND P-CHANNEL FINFET CELL ARCHITECTURE WITH INTER-BLOCK INSULATOR

BACKGROUND

1. Field of the Invention

The present invention relates to integrated circuit devices, cell libraries, cell architectures and electronic design automation tools for integrated circuit devices, including finFET devices.

2. Description of Related Art

FinFET style transistors have been described in D. Hisamoto et al., IEDM, 1998; and N. Lindert et al., IEEE Electron Device Letters, p. 487, 2001. FinFETs have gained acceptance recently as the requirements of low power and compact layout have become more demanding. In CMOS devices, N-type and P-type blocks of transistors are placed in proximity, with insulators in between to prevent latch up, and other problems.

In the design of integrated circuits, standard cell libraries are often utilized. It is desirable to provide a finFET-based design architecture suitable for implementation of cells for a standard cell library, and for implementation of integrated circuits using finFET architectures with flexible layout features.

SUMMARY

For FinFET blocks, the channels of the transistors comprise narrow fins, that can be susceptible to warping or other distortion when formed in regions of unbalanced stress, such as can occur at the edges adjacent the inter-block insulators. Also, for smaller feature sizes, the reliability of polysilicon gate traces traversing the inter-block insulators can be compromised by the non-uniformity of the structures.

FinFET block structures suitable for implementation of a wide variety of cells, and creation of a finFET standard cell libraries for use in integrated circuit design are described which solve these and other problems. Technology is described for deploying design tools for use of finFET block architectures for integrated circuit design, and as components of electronic design automation software and systems. Integrated circuits including cells comprising finFET blocks are described.

BRIEF DESCRIPTION OF THE DRAWINGS

FIG. 2 is a simplified block diagram of a computer system suitable for use with embodiments of the technology, as well as a circuit design and circuit embodiments of the technology.

DETAILED DESCRIPTION

Figure 1:
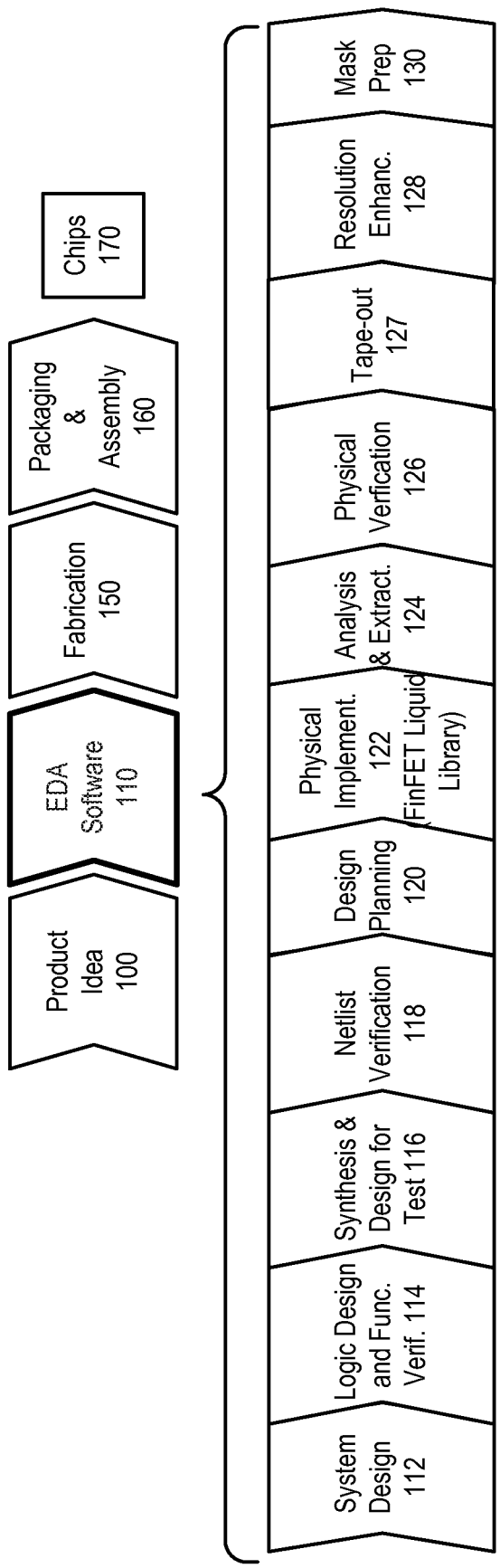
FIG. 1 shows a simplified representation of an illustrative integrated circuit design flow.

FIG. 1 is a simplified representation of an integrated circuit design flow. As with all flowcharts herein, it will be appreciated that many of the steps of FIG. 1 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied. Such rearrangement possibilities will be apparent to the reader.

At a high level, the process of FIG. 1 starts with the product idea (block 100) and is realized in an EDA (Electronic Design Automation) software design process (block 110). When the design is finalized, the fabrication process (block 150) and packaging and assembly processes (block 160) occur, ultimately resulting in finished integrated circuit chips (result 170).

The EDA software design process (block 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (block 110) will now be provided.

System design (block 112): The designers describe the functionality that they want to implement, they can perform what-if planning to refine functionality, check costs, etc. Hardware-software architecture selection can occur at this stage. Example EDA software products from Synopsys, Inc. that can be used at this step include Model Architect, Saber, System Studio, and DesignWare® products.

Logic design and functional verification (block 114): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (block 116): Here, the VHDL/ Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Complier, FPGA Compiler, TetraMAX, and DesignWare® products. Optimization of design for use of finFET blocks as described below can occur in this stage.

Netlist verification (block 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (block 120): Here, an overall floor plan for the chip is constructed and analyzed for timing and top-level routing. Example EDA software products from Synopsys, Inc. that can be used at this step include Astro and IC Compiler products. FinFET block cell selection, layout and optimization can occur at this stage.

Physical implementation (block 122): The placement (positioning of circuit elements) and routing (connection of the same) occurs at this step. Example EDA software products from Synopsys, Inc. that can be used at this step include AstroRail, Primetime, and Star RC/XT products. FinFET block cell layout, mapping and interconnect arrangements can be implemented or optimized at this stage, using for example finFET standard cells based on finFET block cell layouts described herein.

Analysis and extraction (block 124): At this step, the circuit function is verified at a transistor level; this in turn permits what-if refinement. Example EDA software products from Synopsys, Inc. that can be used at this stage include Custom Designer, AstroRail, PrimeRail, Primetime, and Star RC/XT products.

Physical verification (block 126): At this stage various checking functions are performed to ensure correctness for: manufacturing, electrical issues, lithographic issues, and circuitry. Example EDA software products from Synopsys, Inc. that can be used at this stage include the Hercules product.

Tape-out (block 127): This stage provides the "tape-out" data for production of masks for lithographic use to produce finished chips. Example EDA software products from Synopsys, Inc. that can be used at this stage include the CATS(R) family of products.

Resolution enhancement (block 128): This stage involves geometric manipulations of the layout to improve manufacturability of the design. Example EDA software products from Synopsys, Inc. that can be used at this stage include Proteus/Progen, ProteusAF, and PSMGen products.

Mask preparation (block 130): This stage includes both mask data preparation and the writing of the masks themselves. Example EDA software products from Synopsys, Inc. that can be used at this stage include CATS(R) family of products.

Embodiments of the finFET block based technology described herein can be used during one or more of the above-described stages, including for example one or more of stages 116 through 122 and 130. Also, finFET block technology provides flexibility that enables the implementation of engineering change orders ECOs, including modification of the cell sizes during design verification stages.

FIG. 2A is a simplified block diagram of a computer system 210 suitable for use with embodiments of the technology. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, communication network 218 may be any suitable computer network.

User interface input devices 222 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 210 or onto communication network 218.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of some or all of the EDA tools described herein, including the finFET flexible library and tools applied for development of cells for the library and for physical and logical design using the library. These software modules are generally executed by processor 214.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer system 210 itself can be of varying types including a personal computer, a portable computer, a workstation, a computer terminal, a network computer, a television, a mainframe, or any other data processing system or user device. Due to the ever-changing nature of computers and networks, the description of computer system 210 depicted in FIG. 2A is intended only as a specific example for purposes of illustrating the preferred embodiments. Many other configurations of computer system 210 are possible having more or less components than the computer system depicted in FIG. 2A.

FIG. 2B shows a memory 240 such as a non-transitory, computer readable data storage medium associated with file storage subsystem 228, and/or with network interface subsystem 216 can include a data structure specifying a circuit design that includes cells from the finFET flexible library, or other finFET block based cells as described in detail below. The memory 240 can be a hard disk, a floppy disk, a CD-ROM, an optical medium, removable media cartridge, or other medium that stores computer readable data in a volatile or non-volatile form. The memory 240 is shown storing a circuit design 280, including for example an HDL description of a circuit design, that includes one or more finFET block cells created with the described technology. FIG. 2C is a block representing an integrated circuit 290 created with the described technology that includes one or more finFET block cells, and/or cells selected from a finFET flexible library.

Figure 3A:
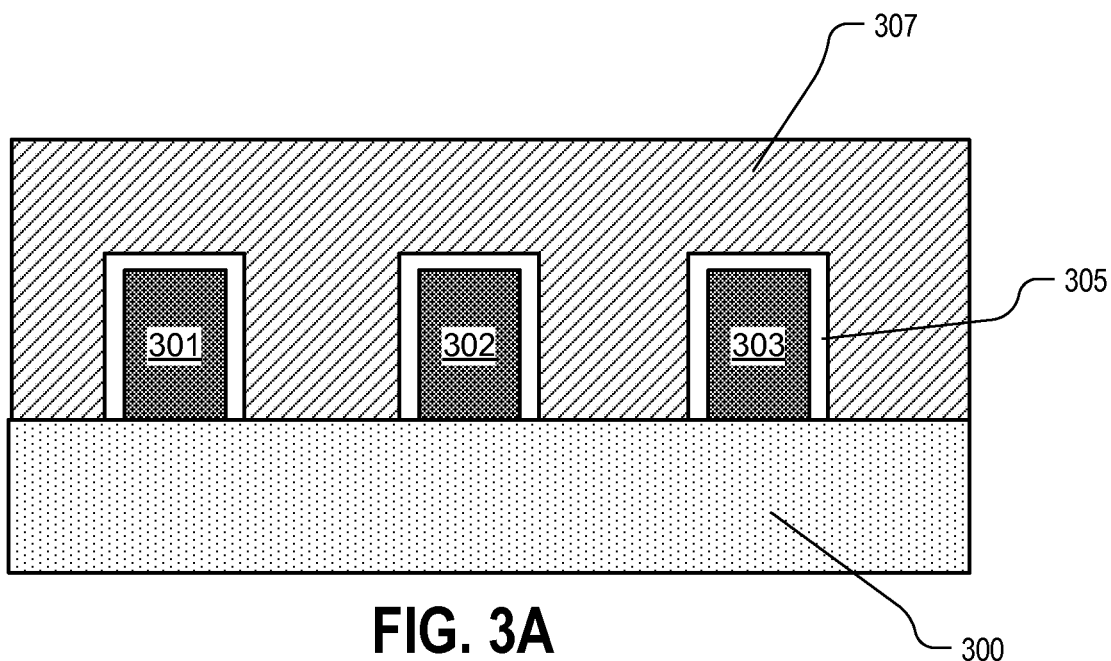
FIGS. 3A and 3B are simplified diagrams showing finFET structures known in the prior art.
Figure 3B:
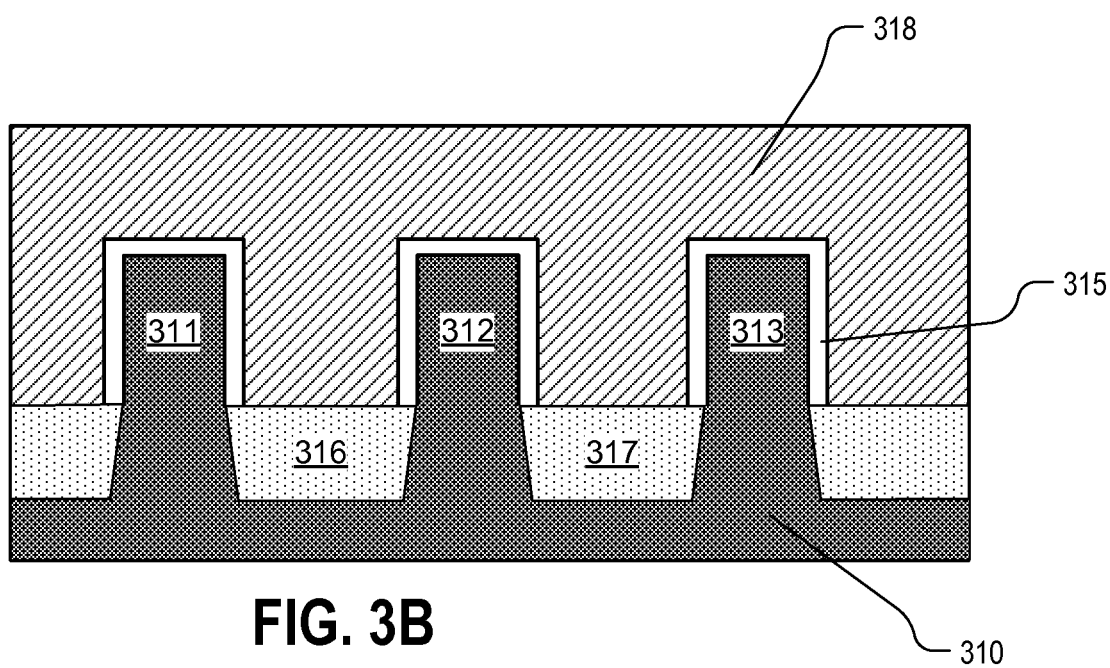

FIGS. 3A and 3B are simplified illustrations showing finFET structures in typical silicon on insulator and bulk substrate configurations, respectively. Both of these basic structures can be used in the FinFET block cells described herein.

In FIG. 3A, a plurality of fins 301, 302, 303 is disposed on an insulating substrate 300, such as is employed in silicon-on-insulator integrated circuits. The fins 301, 302, 303 comprise semiconductor bodies arranged in parallel on the substrate 300, so that they extend into and out of page in FIG. 3A. A gate dielectric layer 305 overlies the sides of the fins 301, 302, 303. A gate conductor 307, which can be implemented using polysilicon for example, extends across the fins and over the gate dielectric layer 305.

FIG. 3B shows a plurality of fins 311, 312, 313 which protrude from a bulk semiconductor body 310, sometimes referred to as body-tied fins. In addition, the individual fins are separated by shallow trench isolation structures 316, 317. A gate dielectric layer 315 overlies the fins, 311, 312, 313. A gate conductor 318 extends across the fins and over the gate dielectric layer 315.

For the embodiments of FIG. 3A and FIG. 3B, on either side of the gate conductor 307, 318, source and drain regions (not shown) are implemented in the fins. The FET transistors that result have source, channel and drain regions in the fins, and a gate overlying the fins. Such transistors are often called multi-gate transistors, because the gate conductor overlies two sides of the fins, and as a result increases the effective width of the channel. The fins used to implement the finFET transistors can be quite narrow. For example, fins having widths on the order of 20 nm or less can be utilized. As a result of the multi-gate gate structure and the narrow widths of the fins, finFET transistors have excellent performance characteristics and small layout areas.

Figure 4:
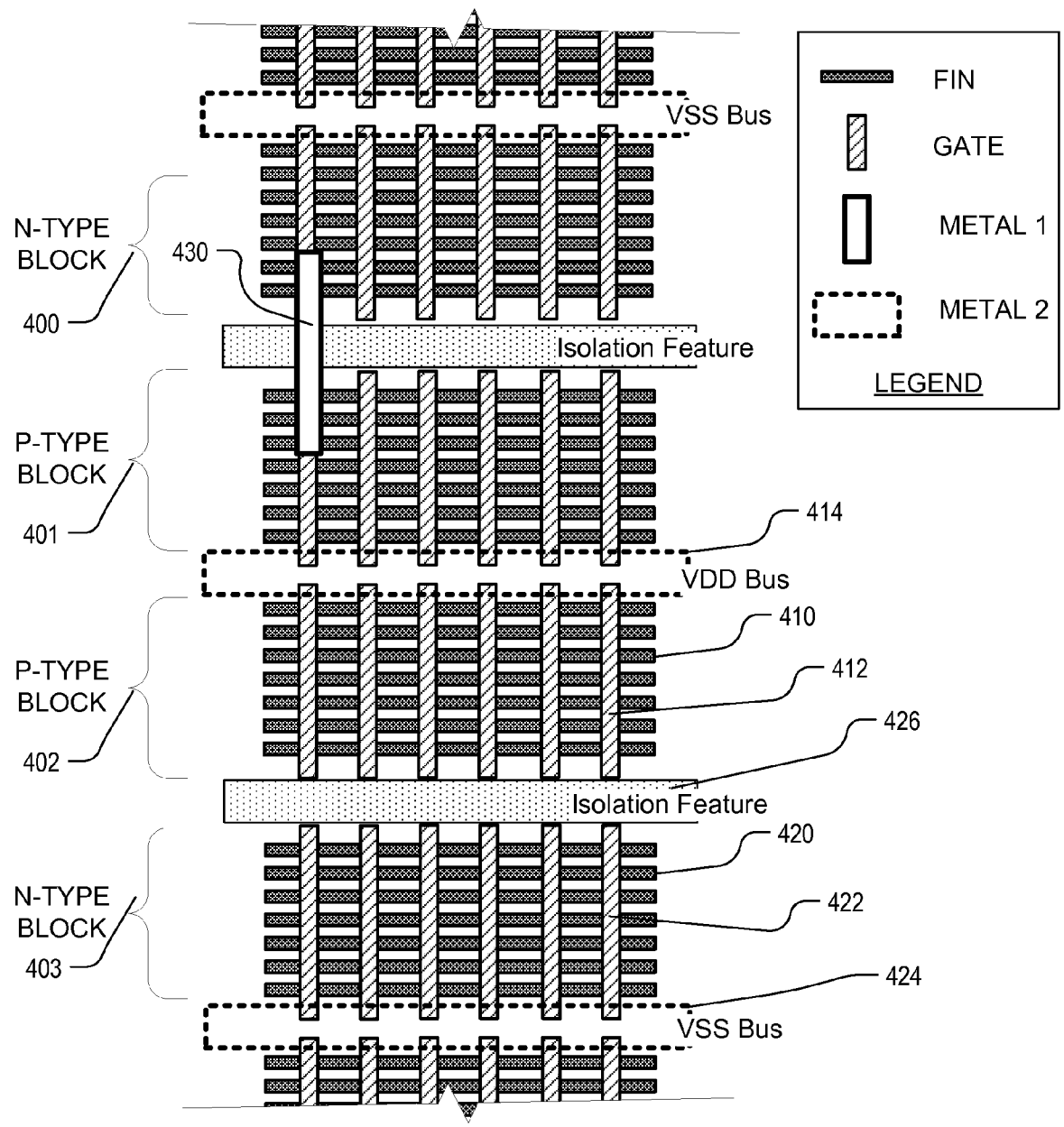
FIG. 4 is a simplified layout diagram of a plurality of finFET blocks having flexible layout features, and suitable for use in the standard cell library.

FIG. 4 illustrates a plurality of finFET blocks in which finFET transistors (and other semiconductor devices) can be arranged to implement cells of a flexible finFET cell library. The legend in FIG. 4 shows the shading for components of the finFET blocks including the shading for a semiconductor fin, the shading for a gate conductor, the shading for a first metal layer (metal 1) and the shading for a second metal layer (metal 2). The shading for a second metal layer is transparent, so that the traces in the second metal layer are shown in outline only, in order to avoid obscuring underlying patterns in the illustration.

The layout in FIG. 4 illustrates a repeating pattern of finFET blocks, suitable for implementation of cells using complementary p-type and n-type transistors, known as CMOS transistors. The pattern includes an n-type block 400, a p-type block 401, a p-type block 402 and an n-type block 403. Isolation features, such as the isolation structure 426, separate the n-type blocks from the p-type blocks. The p-type block 402 includes a set of fins, including fin 410, which are laid out in parallel on the substrate. The set of fins in the p-type block 402 shown in the illustration includes seven members. The number of members in the set of fins making up any given finFET block can vary according to the needs of a particular implementation. The fins can be implemented on an insulating layer, or protrude from an underlying semiconductor body (not shown), as discussed above The n-type block 403 includes a set of fins, including fin 420, which are laid out in parallel on the substrate. The set of fins in the n-type block 403 shown in the illustration includes seven members. Although the drawings herein show that the n-type blocks and the p-type blocks have equal numbers of fins, implementations of the technology can use different numbers of fins in the various blocks. The number of members in the set of fins making up any given finFET block can vary according to the needs of a particular implementation. As with the p-type block, the fins in the n-type block can be implemented on an insulating layer, or protrude from an underlying semiconductor body (not shown), as discussed above.

A patterned gate conductor layer overlies the fins, and includes gate traces (shown with "gate" shading) in the plurality of finFET blocks shown in the diagram arranged along columns. The number of columns can be selected as suits a particular implementation. The p-type block 402 includes gate traces, including gate trace 412, which are elements of the patterned gate conductor layer, and are disposed over and orthogonal to the set of fins in the block 402. The n-type block 403 includes gate traces, including gate trace 422, which are elements of the patterned gate conductor layer, and are disposed over and orthogonal to the set of fins in the block 403.

The gate traces in the p-type block 402 can advantageously be aligned with complementary gate traces in the n-type block 403, as illustrated in the figure, when used for example as a standard library cell layout architecture. Thus, the gate trace 412 in the p-type block 402 is aligned in a column with the gate trace 422 in the n-type block 403, and orthogonal to the fins which are arranged in rows.

An isolation structure 426 is positioned between the p-type block 402 and the n-type block 403. The isolation structure 426 can be used to prevent current leakage as a result of parasitic transistors and the like which may otherwise result from the CMOS cell layout.

The p-type block 401 and n-type block 400, along with an isolation structure between them, can be laid out in a mirror image pattern relative to the combination of the p-type block 402, isolation structure 426 and n-type block 403, as illustrated in the figure.

At least one patterned conductor layer (metal 1, metal 2, etc.) overlies the patterned gate conductor layer in embodiments of the technology described here. In FIG. 4, a first patterned conductor layer (metal 1) includes a plurality of traces, only one of which (430) is illustrated in the Figure to avoid obscuring the basic layout, which overlie the patterned gate conductor layer. The traces in the first patterned conductor layer can be advantageously arranged parallel to the gate traces in the patterned gate conductor layer, and orthogonal to the fins as illustrated by the arrangement of trace 430. This facilitates the use of the first patterned conductor layer for interconnecting gate traces and source/drain regions along columns in the adjacent blocks. The trace 430 is an inter-block trace arranged to connect a gate trace in block 400 to a gate trace in block 401, passing over the isolation structure.

Also in FIG. 4, a second patterned conductor layer (metal 2) includes a plurality of traces (e.g. 414, 424) overlying the patterned gate conductor layer. In embodiments including both patterned conductor layers (metal 1 and metal 2), the second patterned conductor layer overlies the first patterned conductor layer. The traces in the second patterned conductor layer can be advantageously arranged in rows parallel to the fins, and orthogonal to the traces in the first patterned conductor layer. This facilitates the use of the second patterned conductor layer for interconnecting traces in the first patterned conductor layer and gate traces in different columns, and other traces in the first patterned conductor layer. The fins, traces in the gate conductor layer, traces in the first patterned conductor layer and traces in the second patterned conductor layer can be interconnected in any desired pattern using vertical conductors sometimes referred to as plugs in vias through interlayer insulators (not shown in FIG. 4).

The traces 414 and 424 in the second patterned conductor layer are used as power buses, and adapted to be coupled to power supply voltages. In this example, the trace 414 is a VDD bus and the trace 424 is a VSS bus. In the repeating layout shown in FIG. 4, a VDD bus is positioned between adjacent p-type blocks and a VSS bus is positioned between adjacent n-type blocks. Although not required, power busses positioned between adjacent blocks (of the same conductivity type in this example) as shown in FIG. 4 can be tied to the bulk semiconductor body for biasing the body. In other embodiments, the power busses can be positioned anywhere over or adjacent to the corresponding blocks of fins, using busses that do not include body ties. CMOS devices can be implemented between the VDD bus trace 414 and the VSS bus trace 424 utilizing the structures in the p-type block 402 and the n-type block 403.

Figure 5:
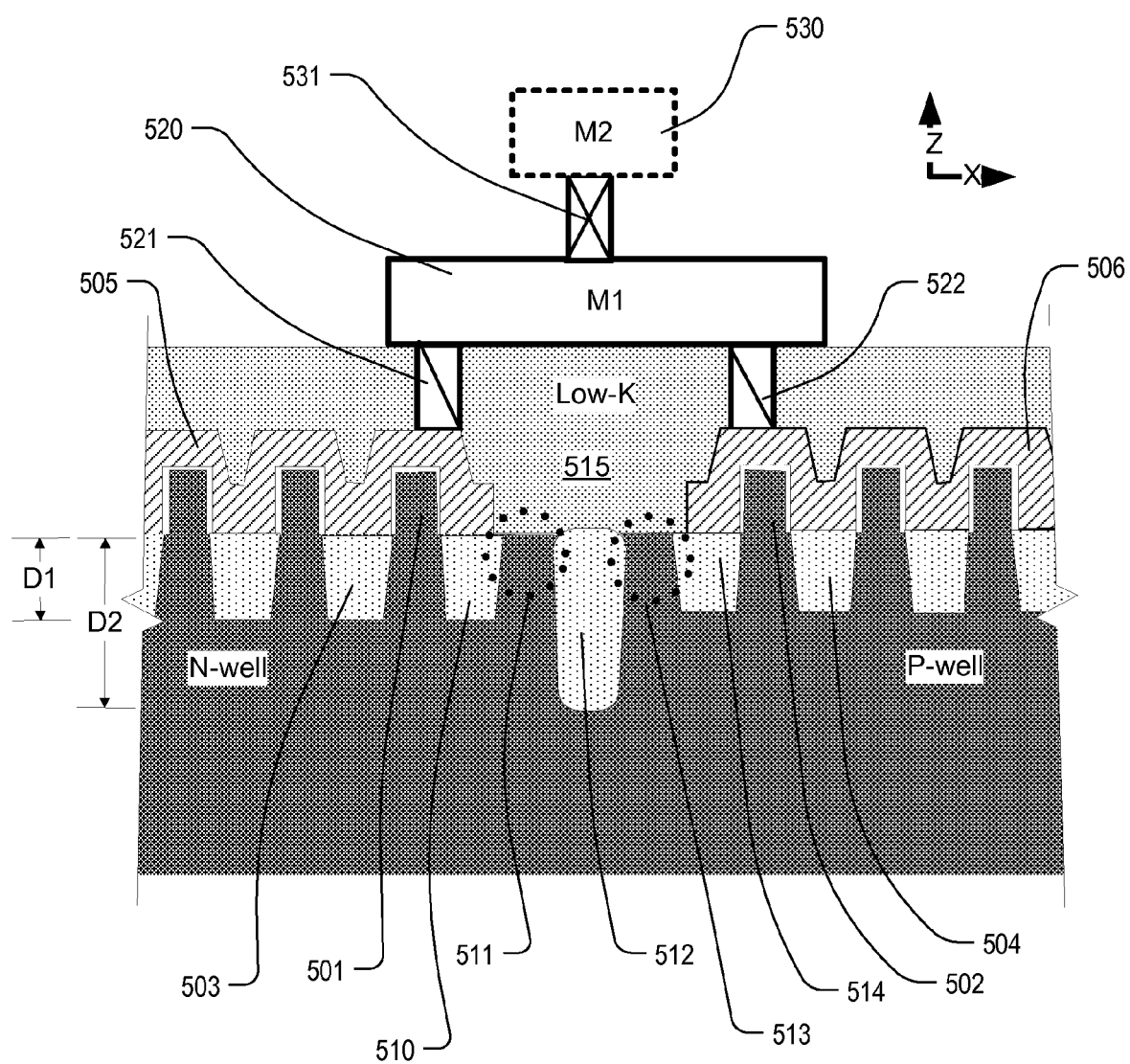
FIG. 5 is a cross-section view of an isolation structure suitable for use between finFET blocks in a structure like that of FIG. 4.

FIG. 5 is a cross-section taken along the gate traces in the regions spanning between a p-type block and an n-type block, like blocks 402 and 403 shown in FIG. 4. A p-type block is implemented in an n-well region of the substrate, and includes a plurality of semiconductor fins. A fin 501 lies on the edge of the p-type block, and can be referred to as outer fin 501 for the purposes of this description. Trench isolation structures, including structure 503 lie between the fins in the p-type block. Likewise, a fin 502 lies on the edge of the n-type block, and can be referred to as outer fin 502 for the purposes of this description. Trench isolation structures, including structure 504 lie between the fins in the n-type block. The fins and the trench isolation structures can be implemented in a manner that is substantially uniform across the respective blocks. As a result, stress on the fins caused by the surrounding structures does not significantly distort the fins.

The isolation structure shown in FIG. 5 includes a first trench isolation structure 510, a first fin-like portion 511 of the semiconductor body, a deep trench isolation structure 512, a second fin-like portion 513 of the semiconductor body, and a second trench isolation structure 514. Also, the gate trace 505 overlying the p-type block and the gate trace 506 overlying the n-type block terminate near the edges of the isolation region, for example over the trench isolation structures 510 and 514 respectively.

FIG. 5 illustrates an isolation structure (e.g. 426 of FIG. 4) including an inter-block insulator in a region between p-type finFET blocks and n-type finFET blocks. In some embodiments, other isolation structures may be utilized, including wide insulating trenches. The isolation feature comprises an inter-block insulator in the substrate between the outer edges of adjacent blocks. The inter-block insulator can comprise one or more insulator filled trenches, and arranged in parallel with the outer fins of the first and second blocks.

In the embodiment shown in FIG. 5, the inter-block insulator comprises a first insulator filled trench (e.g. trench isolation structure 510) adjacent the outer fin 501 of the first block, a second insulator filled trench (e.g. trench isolation structure 514) adjacent the outer fin 502 of the second block, and a third insulation filled trench (e.g. trench isolation structure 512) between the first and second insulator filled trenches. Although we refer to first and second insulator filled trenches, they can be made in one processing step after the deeper, third insulator filled trench. Therefore, the use of the terms first and second is for illustration purposes only and does not mean necessarily that they are implemented using separate masks or separate processing steps.

The semiconductor fins in the first and second blocks are separated by insulator filled trenches (e.g. structures 503, 504) having a first depth D1 in the substrate, and inter-block insulator comprises an insulator filled trench (e.g. trench isolation structure 512) having a depth D2 in the substrate greater than the first depth D1.

The inter-block insulator shown in FIG. 5 includes means for balancing stress on the outer fins 501, 502 of the first and second blocks with stress due to structures (503, 504) between the outer fins and the inner fins of the corresponding sets of semiconductor fins.

The means for balancing stress in this example includes a combination of the first fin-like portion 511 and the first trench isolation structure 510, which is characterized by having a structure that is sufficiently like that of the outer fin 501 and the trench isolation structure 503 in the p-type block, that distortion of the outer fin 501 in the p-type block, that would otherwise result from asymmetrical stress from structures on opposing sides of the outer fin 501, is substantially reduced. Likewise, the combination of the second fin-like portion 513, and the second trench isolation structure 514 is characterized by having a structure that is sufficiently like that of the outer fin 502 and the trench isolation structure 504 in the n-type block, that distortion of the outer fin 502 in the n-type block, that would otherwise result from asymmetrical structures is substantially reduced. The width of the fin-like portions 511, 513 may be significantly greater than the width of the fins in some embodiments. Also, the fin-like portions 511, 513 may have top surfaces that are aligned with the top surfaces of the fin 501 and the fin 502 in some embodiments. Other embodiments include more than one fin-like portion/trench combination between the central insulator filled trench and the outer fins of the blocks.

Also, the deep trench isolation structure 512 in this example extends substantially deeper into the semiconductor body than the trench isolation features between the fins, in order to provide greater isolation performance. Structural stress induced by the deep trench isolation structure 512 is buffered from fins in the p-type block by the combination of the first fin-like portion 511, and the first trench isolation feature 510, and from the fins in the n-type block by the complementary structures 513, 514. The deep trench isolation structure can be wider than shown in the figure. In the Figure, the width of the isolation structure, including elements 510 to 514 can be on the order of 5 feature widths. Alternatively, the structure can have larger widths by increasing the width of the deep trench isolation structure 512, and of the other elements. Because the connection of the gate traces 505 and 506 on the opposing sides of the isolation structure, is made using patterned metal layer and because the gate traces are not tied or contacted over the isolation structure, the width does not impact reliability or performance of the gate traces.

An insulating fill 515 provides an interlayer insulator between the patterned gate conductor layer including the gate traces 505 and 506, and overlying patterned conductor layers, including the first patterned conductor layer M1 in this example. The insulating fill 515 can be implemented using material having a relatively low dielectric constant, relative to that of silicon dioxide (low-K materials), if desired for a particular implementation. The insulating fill 515 can be planarized, without impacting the isolation structure (including the deep trench isolation structure 512) and without impacting the patterned gate conductor layer. Connections between gate traces in adjacent blocks can be implemented using the first patterned conductor layer M1 by forming trace 520 that extends in a line parallel with the gate traces 505, 506. Interlayer connectors, such as plugs 521 and 522 extend through vias in the insulating fill 515 to connect gate traces 505 and 506, respectively, to the trace 520. Orthogonal traces (e.g. trace 530) in the second patterned conductor layer M2 can be utilized to interconnect traces, such as trace 520, in the first patterned conductor layer M1, as discussed above in connection with FIG. 4. Connections between the trace 530 in the second patterned conductor layer M2 and trace 520 in the first patterned conductor layer M1 can be implemented using an inter-layer connector, such as a plug 531 extending through a via in an interlayer insulator (not shown).

Figure 6A:
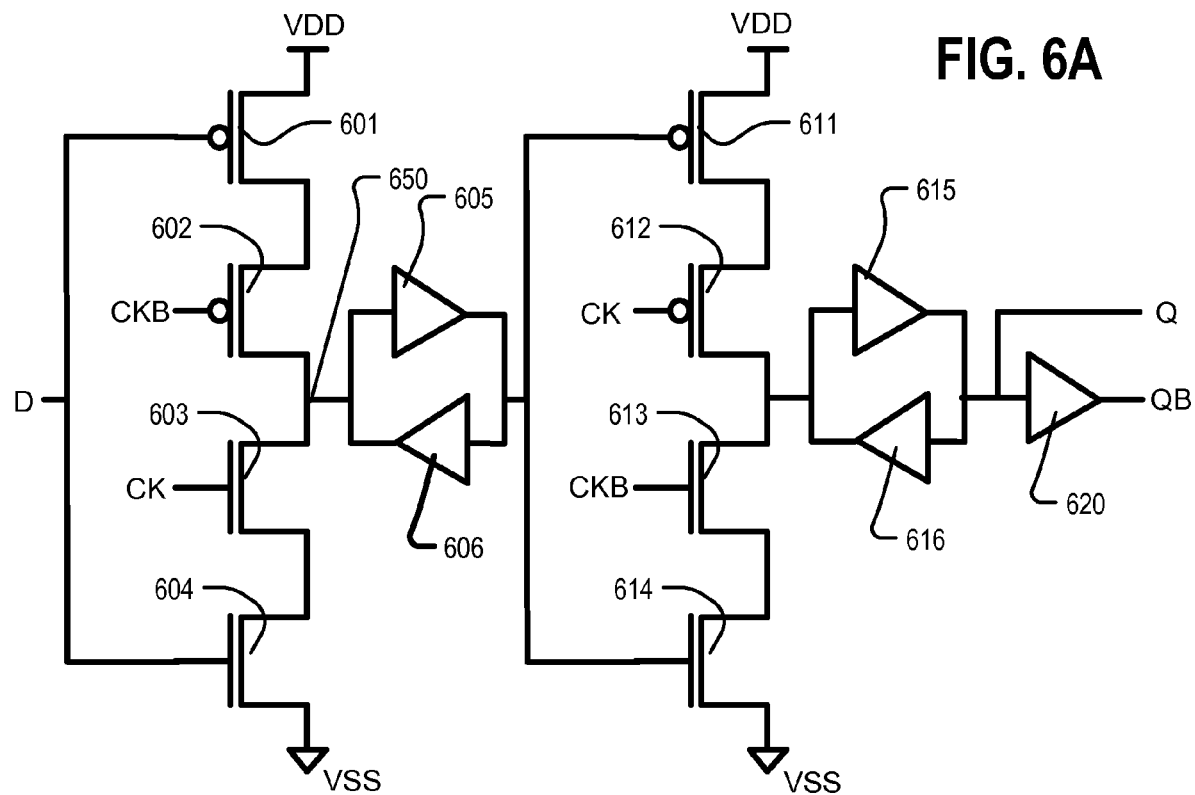
FIGS. 6A and 6B are schematic diagrams of a circuit, including a D flip-flop and a clock driver, suitable for implementation as a standard cell using a finFET block architecture as described herein.
Figure 6B:
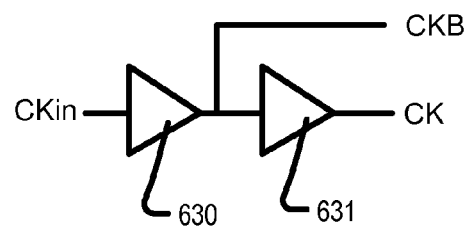

FIGS. 6A and 6B are schematic diagrams of a representative cell comprising a D flip-flop and clock buffer, respectively, which can be implemented using the finFET block architecture described herein, and included in a cell library for use in integrated circuit design. The basic D flip-flop includes a first stage having a D input, a CKB input and a CK input. The basic D flip-flop includes an output Q and an inverted output QB.

The first stage includes p-type transistors 601 and 602 in series between the power bus VDD and node 650, and n-type transistors 603 and 604 in series between the ground bus VSS and the node 650. The CKB and CK inputs are connected to p-type transistor 602 and n-type transistor 603, respectively, and the D input is coupled to both p-type transistor 601 and n-type transistor 604. The node 650 between the p-type and n-type transistors is coupled to the input of a latch that comprises inverters 605 and 606 arranged in a feedback relationship. A second stage of the D flip-flop is similar, having input coupled to the output of the latch in the first stage, CKB input and a CK input. The second stage includes p-type transistors 611 and 612 in series between the power bus VDD and an output node, and n-type transistors 613 and 614 in series between the ground bus VSS and the output node. The CKB and CK inputs are connected to n-type transistor 613 and p-type transistor 612, and the output of the first stage is coupled to both p-type transistor 601 and n-type transistor 604. The node between the p-type and n-type transistors is coupled to the input of a latch that comprises inverters 615 and 616 arranged in a feedback relationship. The output Q of the D flip-flop is provided at the output of the latch comprising inverters 615 and 616. An output inverter 620 drives the inverted output QB of the D flip-flop.

In FIG. 6B, the basic structure of a clock driver is shown. The input to the clock driver is a clock signal CKin. The clock driver includes a first inverter 630 and a second inverter 631 in series. The output of the first inverter 630 is the inverted clock CKB, and the output of the second inverter 631 is the clock CK, both of which are used in the D flip-flop as illustrated in FIG. 6A. In one example cell, a set including for example four (4) D flip-flops can be combined with a shared clock driver. In such cases, the clock driver can be designed to drive all four flip-flops. In this example, the inverters in the clock driver can comprise two or more p-type transistors in parallel between VDD and the output node, and two or more n-type transistors in parallel between VSS and the output node.

The circuit of FIGS. 6A and 6B can be implemented using the finFET block architecture described herein. An example implementation is described with reference to layout diagrams in FIGS. 7-9, which show the four transistor, D flip-flop input stage, a latch and a clock buffer.

Figure 7:
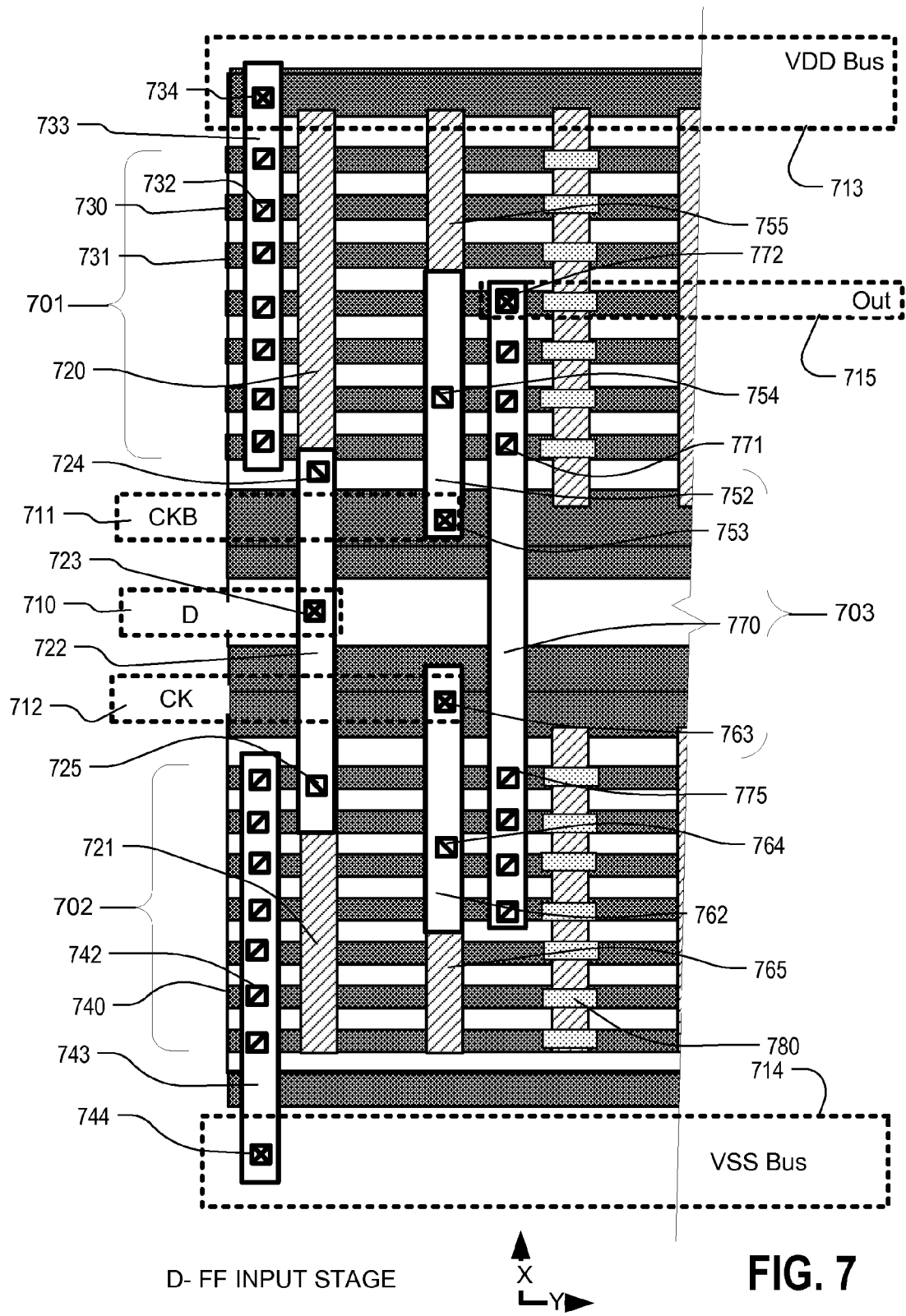
FIGS. 7-9 illustrate implementation of components of the circuit of FIGS. 6A and 6B utilizing a finFET block architecture like that shown in FIG. 4.

In FIG. 7, the finFET block layout includes a p-type finFET block 701, a n-type finFET block 702 and an isolation structure in region 703. The inputs of the circuit shown in FIG. 6A, including the D input, the true clock CK input, the inverted clock CKB input, the VDD bus and a VSS bus are connected to traces 710-714, respectively, in the second conductor layer (metal 2). Likewise the output of the stage (corresponding to node 650 in FIG. 6A) is connected to a trace 715 in the second conductor layer. Three types of plugs interconnecting the layers are represented in the figure. Plugs, such as plug 732, in block 701 represented by a square with a single cross line from the lower left corner to the upper right corner connect the traces in the first patterned conductor layer to source/drain terminals on the fins. Plugs, such as plug 724, connected to gate trace 720 in block 701 represented by a square with a single cross line from the upper left corner to the lower right corner, connect the traces in the first patterned conductor layer to gate traces in the patterned gate conductor layer. Plugs, such as plug 723, connected to the input trace 710, represented by a square with an "X" pattern of crossed lines, connect the traces in the second patterned conductor layer to traces in the first patterned conductor layer and/or to lower layers.

The D input signal on trace 710 is connected to trace 722 in the first patterned conductor layer via the plug 723. The trace 722 is connected to gate traces 720 and 721 in the p-type and n-type blocks via plugs 724, 725. The gate traces 720 and 721 correspond to the gates of transistors 601 and 604 in FIG. 6A. The source terminals on the fins (e.g. fins 730, 731) adjacent the gate trace 720 are connected to metal 1 trace 733 via plugs including plug 732. The metal 1 trace 733 is connected to the VDD bus 713 via plug 734. Likewise, the source terminals on the fins (e.g. fin 740) adjacent the gate trace 721 are connected to metal 1 trace 743 via plugs (e.g. plug 742). Metal 1 trace 743 is connected via plug 744 to the VSS bus 714. The source/drain terminals to the right of gate traces 720 and 721 are shared with the adjacent transistors, and not coupled to overlying conductors in this example. The inverted clock CKB signal on metal 2 trace 711 is connected to metal 1 trace 752 via plug 753. Trace 752 is connected to gate trace 755 in the p-type block, via plug 754. The gate trace 755 corresponds to the gate of transistor 602 in FIG. 6A. The clock CK input on metal 2 trace 712 is connected via plug 763 to metal 1 trace 762. The metal 1 trace 762 is connected via plug 764 to the gate trace 765 in the n-type block. The gate trace 765 corresponds to the gate of transistor 603 in FIG. 6A. The drain terminals in the fins to the right of gate trace 755 are connected via plugs (e.g. plug 771) to metal 1 trace 770. The metal 1 trace 770 spans across the isolation region 703, and is connected via plugs (e.g. plug 775) to the fins in the n-type block. Also the metal 1 trace 770 is connected via plug 772, to the metal 2 trace 715, providing the output of the input stage (corresponding to node 650 in FIG. 6A) of the D flip-flop. The gate traces in both the p-type block and the n-type block which are to the right of the metal 1 trace 770 in this layout include isolation structures (e.g. 780) that can comprise insulator filled trenches that cut though the gate traces and the underlying fins, and serve to divide the input stage from other circuit elements (not shown) further to the right.

Figure 8:
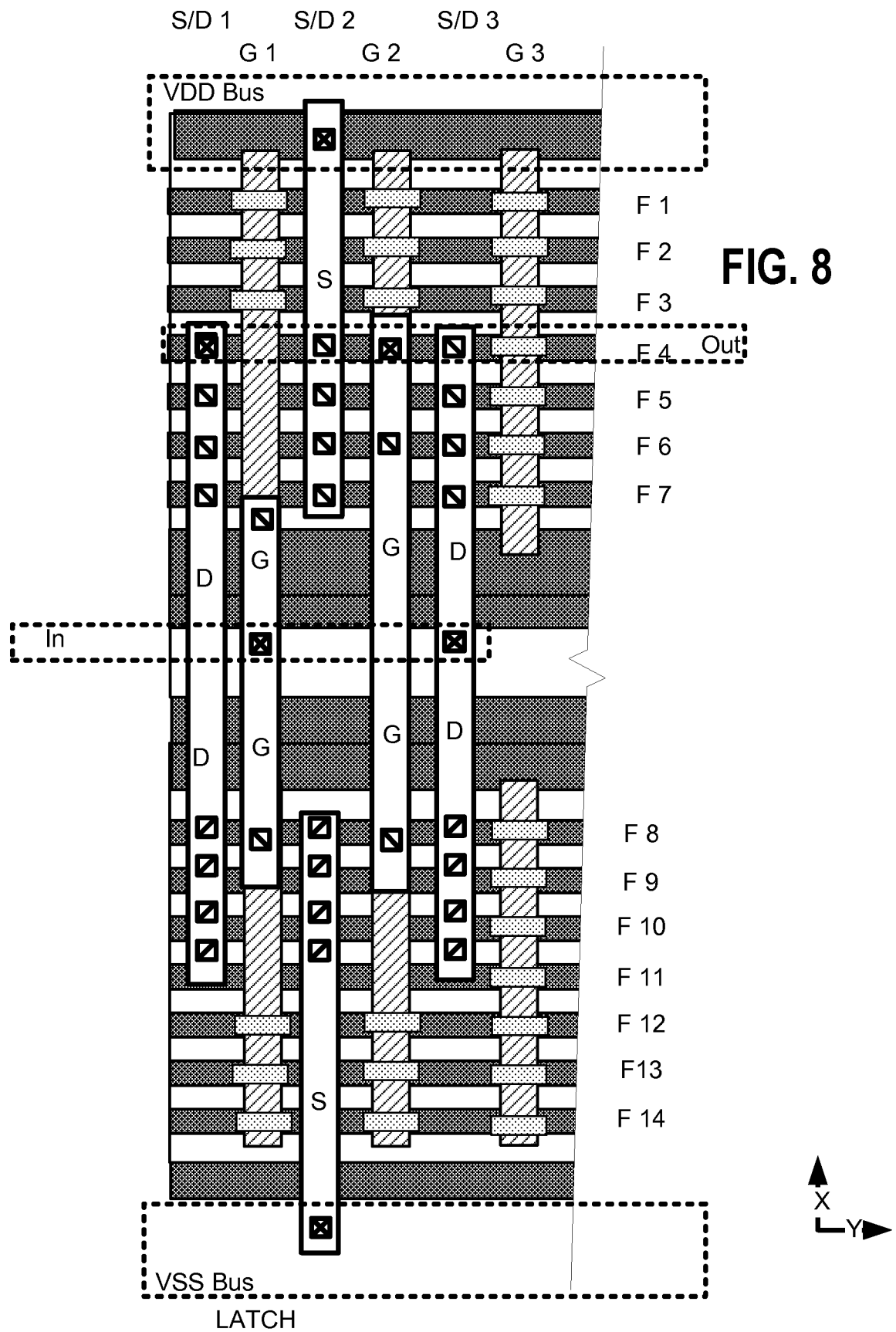

FIG. 8 is a layout diagram of a finFET block structure, like that of FIG. 7, connected as a latch circuit which can be used as a component of a D flip-flop as shown in FIG. 6A. In FIG. 8, the finFET block structure is labeled with columns and rows as a means of simplifying the description. The labeled columns include source/drain columns S/D1 to S/D3, which comprise columns of source/drain terminals on the fins between gate traces, and gate columns G1 to G3, which comprise the locations of gate traces that overlie the fins. The labeled rows include fin rows F1 to F14, which comprise the semiconductor body fins in the block. The metal 1 traces, metal 2 traces, gate traces and fins are identified by their location in the columns and rows in the following description.

The latch circuit in FIG. 8 includes first and second inverters, each of which includes a p-type transistor and an n-type transistor in series, and having their gates connected in common, and so includes four transistors.

The layout includes a metal 2 trace over the isolation structure connected to provide the input of the latch, such as would be connected to the trace 715 of FIG. 7. The metal 2 trace over the isolation structure is connected to a metal 1 trace on column G1, corresponding to the input of the first inverter, and a metal 1 trace on column S/D3, corresponding to the output of the second inverter. The metal 1 trace on column G1 extends over both the p-type and n-type blocks, connecting the gate traces for the fins making up the p-type transistor to the gate traces on the fins making up the n-type transistor of the first inverter. The metal 1 trace on column S/D3 extends over both the p-type and n-type blocks, connecting the source/drain terminals in the fins in the p-type block and the source/drain terminals in the fins in the n-type block, which provide the output of the second inverter.

The layout includes a metal 2 trace over row F4 which provides the output signal of the latch. The metal 2 trace on row F4 is connected to a metal 1 trace on column S/D1, corresponding to the output of the first inverter, and a metal 1 trace on column G2, corresponding to the input of the second inverter. The metal 1 trace on column S/D 1 extends over both the p-type and n-type blocks, connecting the source/drain terminals on the fins making up the p-type transistor to the source/drain terminals on the fins making up the n-type transistor of the first inverter. The metal 1 trace on column G2 extends over both the p-type and n-type blocks, connecting the gate traces in column G2 in the p-type block and the gate traces in column G2 in the n-type block, which overlie the channels on the fins making up the p-type transistor and on the fins making up the n-type transistor of the second inverter. The metal 1 trace on column G2 corresponds to the input of the second inverter.

The metal 1 trace in column S/D2 over the p-type block connects the source/drain terminals in column S/D2 to the metal 2 trace acting as a VDD bus. Likewise, the metal 1 trace in column S/D2 over the n-type block connects the source/drain terminals in column S/D2 to the metal 2 trace acting as a VSS bus.

As illustrated in FIG. 8, isolation structures (like the isolation structures 780 described in FIG. 7) in the gate traces separate unused fins from those used in the circuit being implemented.

Figure 9:
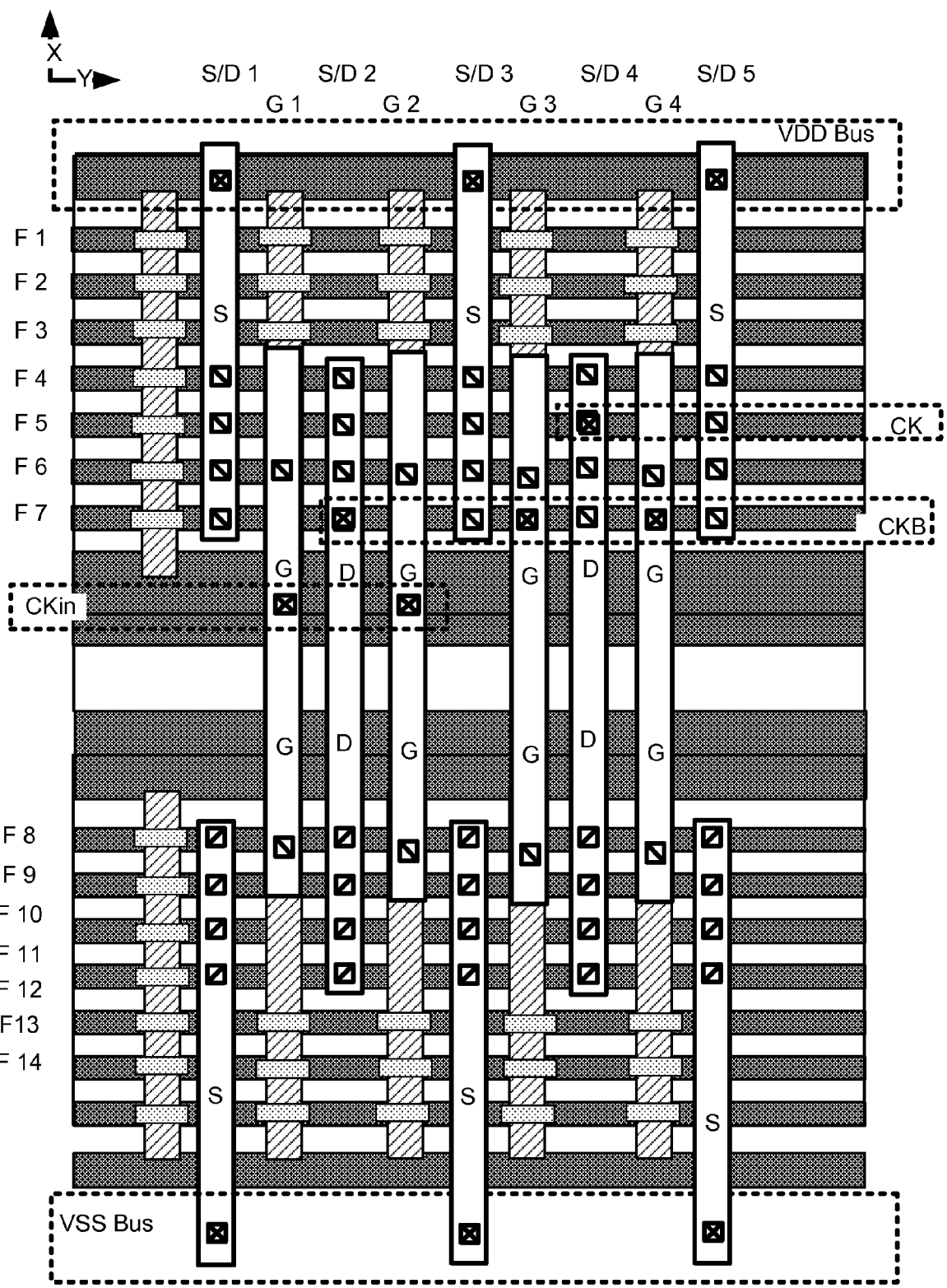

FIG. 9 illustrates a layout of an eight transistor clock driver, comprising two inverters in series, where each inverter includes two p-type and two n-type transistors in parallel. The clock driver having this layout should be strong enough to drive clock signals for a number of D flip-flops, such as 4 D flip-flops, in a standard cell. Input is provided on a metal 2 trace over the isolation cell and is coupled to metal 1 traces in columns G1 and G2. The metal 1 trace in the column G1 is connected to the gate traces over the fins making up the p-type and n-type transistors in the column G1. The metal 1 trace in the column G2 is connected to the gate traces over the fins making up the p-type and n-type transistors in the column G2.

A first metal 1 trace in the column S/D 1 is connected to the source/drain terminals in the p-type block and to the metal 2 trace making up the VDD bus. A second metal 1 trace in the column S/D1 is connected to the source/drain terminals in the n-type block and to the metal 2 trace making up the VSS bus. In a similar fashion, a first metal 1 trace in the column S/D3 is connected to the source/drain terminals in the p-type block, and to the metal 2 trace making up the VDD bus. A second metal 1 trace in the column S/D3 is connected to the source/ drain terminals in the n-type block, and to the metal 2 trace making up the VSS bus.

A metal 1 trace in the column S/D2 extends across both the p-type block and the n-type block, and is connected to the source/drain terminals in the p-type block and in the n-type block, which are driven by both the transistors on the left and the transistors on the right in parallel. The metal 1 trace in the column S/D2 is connected to the metal 2 trace in row F7 which provides the inverted clock CKB output.

The metal 2 trace in row F4 is also connected to the metal 1 traces in columns G3 and G4, which act as the inputs for the parallel transistor pairs of the second inverter. The metal 1 trace in the column G3 is connected to the gate traces over the fins making up the p-type and n-type transistors in the column G3. The metal 1 trace in the column G4 is connected to the gate traces over the fins making up the p-type and n-type transistors in the column G4.

The first metal 1 trace in the column S/D3 is connected to the source/drain terminals in the p-type block to the left of column G3 and to the metal 2 trace making up the VDD bus. The second metal 1 trace in the column S/D3 is connected to the source/drain terminals in the n-type block and to the metal 2 trace making up the VSS bus. In a similar fashion, a first metal 1 trace in the column S/D5 is connected to the source/ drain terminals in the p-type block and to the metal 2 trace making up the VDD bus. A second metal 1 trace in the column S/D5 is connected to the source/drain terminals in the n-type block, and to the metal 2 trace making up the VSS bus.

A metal 1 trace in the column S/D4 extends across both the p-type block and the n-type block, and is connected to the source/drain terminals in the p-type block and in the n-type block, which are driven by both the transistors on the left and the transistors on the right in parallel. The metal 1 trace in the column S/D4 is connected to the metal 2 trace in row F5 which provides the buffered clock CK output.

The layout shown in FIG. 9 implements parallel transistors that use four ( ) fins each for a total of eight fins. Because the finFET block is only seven fins high, the implementation of an eight fin transistor required implementation using a least two additional gate columns, and only partial utilization of the fins.

In the embodiment shown in FIG. 9, the eight transistor clock buffer layout leaves a number of fins unused (for example, fins F1-F3 and fins F12-F14). These unused fins can be utilized to adjust a circuit design during a design flow for a particular integrated circuit, to change the strength or speed of the buffers. Also, the unused fins can be utilized to implement an engineering change order ECO on a given circuit layout that may occur after a complete layout and testing has occurred.

Figure 10:
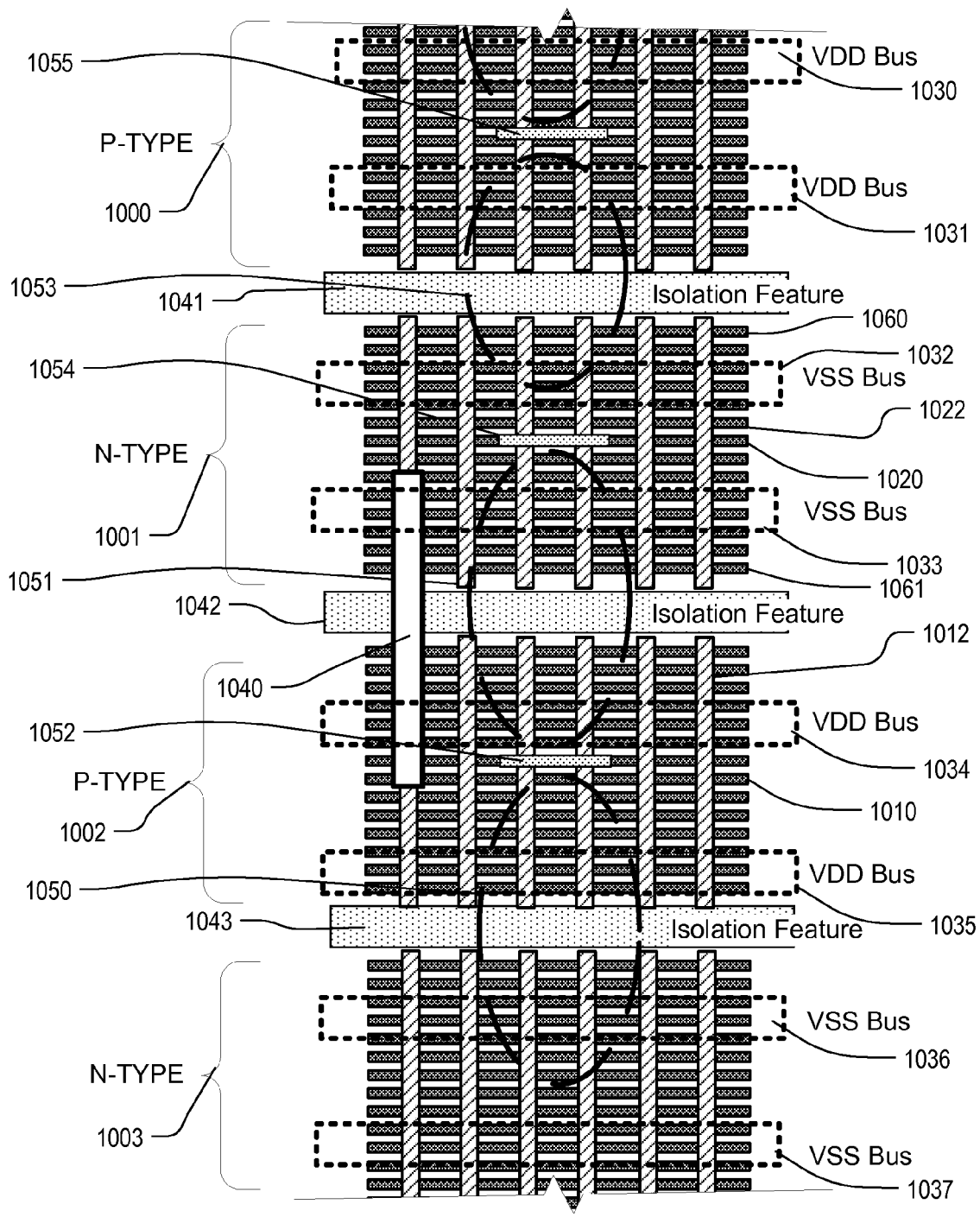
FIG. 10 is a simplified layout diagram of a plurality of "tall" finFET blocks having floating power bus structures and other flexible layout features, and suitable for use in a flexible standard cell library.

FIG. 10 illustrates a floating power bus layout, including a plurality of "tall" finFET blocks in which finFET transistors (and other devices) can be arranged to implement cells of a finFET liquid cell library. The drawing in FIG. 10 can be understood using the legend in FIG. 4.

The layout in FIG. 10 illustrates a repeating pattern of finFET blocks, suitable for implementation of cells using complementary p-type and n-type transistors, known as CMOS cells. The pattern includes alternating tall p-type and tall n-type blocks, including a p-type block 1000, an n-type block 1001, a p-type block 1002 and an n-type block 1003. Isolation features 1030, 1031, 1032, which can comprise structures like that of FIG. 5, separate the n-type blocks from the p-type blocks. The p-type block 1002 includes a set of fins, including fin 1010, which are laid out in parallel on the substrate. The set of fins in the p-type block 1002 shown in the illustration includes fourteen members, to choose an example that includes twice as many fins as the example described with reference to FIG. 4. The set of fins in a particular block (e.g. 1000-1003) include outer fins (e.g. fins 1060, 1061 in region 1001) on outside edges of the sets of fins, and inner fins between the outer fins arranged in a pattern identifiable as separate from the pattern of fins in adjacent blocks, and preferably with uniform spacing between the fins within the block. The number of members in the set of fins making up any given finFET block can vary according to the needs of a particular implementation. It may be advantageous for a particular implementation to use a number of fins that is a power of 2, such as 16 fins, 32 fins and so on. The fins can be implemented on an insulating layer, or protrude from an underlying semiconductor body (not shown), as discussed above The n-type block 1001 includes a set of fins, including fin 1020, which are laid out in parallel on the substrate. The set of fins in the n-type block 1001 shown in the illustration includes the same number of fins as the corresponding p-type blocks 1000 and 1002. The fins in the n-type block can be more narrow than those in the p-type block, as illustrated, because of the differences in carrier mobility for the devices. The number of members in the set of fins making up any given finFET block can vary according to the needs of a particular implementation, but can advantageously match the number of fins in its complementary p-type block, when used for example as a standard library cell layout architecture. As with the p-type block, the fins in the n-type block can be implemented on an insulating layer, or protrude from an underlying semiconductor body (not shown), as discussed above.

A patterned gate conductor layer overlies the fins, and it includes gate traces (shown with "gate" shading) in the plurality of finFET blocks shown in the diagram arranged along columns. The number of columns can be selected as suits a particular implementation. The p-type block 1002 includes gate traces, including gate trace 1012, which are elements of the patterned gate conductor layer, and are disposed over and orthogonal to the set of fins in the block 1002. The n-type block 1001 includes gate traces, including gate trace 1022, which are elements of the patterned gate conductor layer, and are disposed over and orthogonal to the set of fins in the block 1001.

The gate traces in the p-type block 1002 can advantageously be aligned in columns with complementary gate traces in the n-type block 1001, as illustrated in the figure, when used for example as a standard library cell layout architecture. Thus, the gate trace 1012 in the p-type block 1002 is aligned in a column with the gate trace 1022 in the n-type block 1001, and orthogonal to the fins which are arranged in rows.

An isolation structure 1042 is positioned between the p-type block 1002 and the n-type block 1001. The isolation structure 1042 can be used to prevent current leakage as a result of parasitic transistors and the like which may otherwise result from the CMOS cell layout.

The p-type block 1000 and n-type block 1003, along with isolation structures 1041 and 1043, can be laid out in a repeating pattern relative to the combination of the p-type block 1002, isolation structure 1030 and n-type block 1001, as illustrated in the figure.

At least one patterned conductor layer (metal 1, metal 2, etc.) overlies the patterned gate conductor layer in embodiments of the technology described here. In FIG. 10, a first patterned conductor layer (metal 1) includes a plurality of traces, only one of which (1040) is illustrated in the figure to avoid obscuring the basic layout, which overlie the patterned gate conductor layer. The traces in the first patterned conductor layer can be advantageously arranged parallel to the gate traces in the patterned gate conductor layer, and orthogonal to the fins as illustrated by the arrangement of trace 1040. This facilitates the use of the first patterned conductor layer for interconnecting gate traces and source/drain regions along columns in the adjacent blocks.

Also in FIG. 10, a second patterned conductor layer (metal 2) includes a plurality of traces (1030 to 1037) overlying the patterned gate conductor layer. In embodiments including both patterned conductor layers (metal 1 and metal 2), the second patterned conductor layer overlies the first patterned conductor layer. The traces in the second patterned conductor layer can be advantageously arranged in rows parallel to the fins, and orthogonal to the traces in the first patterned conductor layer. This facilitates the use of the second patterned conductor layer for interconnecting traces in the first patterned conductor layer and gate traces in different columns, and other traces in the first patterned conductor layer. The fins, traces in the gate conductor layer, traces in the first patterned conductor layer and traces in the second pattern conductor layer can be interconnected in any desired pattern using vertical conductors sometimes referred to as plugs in vias through interlayer insulators (not shown in FIG. 10).

The traces 1030 to 1037 in the second patterned conductor layer that are illustrated in FIG. 10 overly inner fins in the set of fins in the corresponding regions are used as power buses, and adapted to be coupled to power supply voltages. As compared to the structures illustrated in FIGS. 4 and 7-9 where the power bus traces are placed outside the outer fins in the corresponding regions to accommodate for example use of body ties between the power buses and the substrate, the structure of FIG. 10 provides flexibility in the utilization of the FinFET blocks. In this example, the traces 1034 and 1035 are VDD bus traces over the inner fins in the p-type block 1002. The traces 1032 and 1033 are VSS bus traces over the inner fins in the n-type block 1001. In a flexible layout, a plurality of VDD bus traces are positioned over each p-type block over rows selected to optimize power distribution in the circuits being implemented. Likewise, a plurality of VSS bus traces are positioned over each n-type block without constraints on placement that would be introduced by a requirement for body ties, over rows selected to optimize power distribution in the circuits being implemented. So, embodiments could be implemented where a single "tall" finFET block, including a plurality of power buses overlying it, is arranged with complementary finFET blocks that include only one power bus. The power traces are preferably essentially straight and parallel with the fins, over the regions including sets of fins. In other embodiments, the power traces can have more complex shapes, including T-shapes, L-shapes and so on, over the regions that include the sets of fins. In a given block architecture, one, two, three or more power buses may be placed over a single set of fins.

CMOS devices can be implemented in a region 1050 using connections between the VDD bus 1034 in p-type block 1002 and the VSS bus 1033 in the n-type block 1001, utilizing the fins in the p-type block 1002 and the n-type block 1001 (upper devices). Also, CMOS devices can be implemented in a region 1051 using connections between the VDD bus 1035 in p-type block 1002 and the VSS bus 1036 in the n-type block 1003, utilizing the fins in the p-type block 1002 and the n-type block 1003 (lower devices). Suitable isolation structures (e.g. 1052) can be formed in the fins and gate traces between the regions 1050 and 1051, such as by a providing a patterned trench filled with insulating material. Likewise, the n-type block 1001 can be used with the p-type block 1000 for CMOS devices in region 1053, with appropriate isolation 1054. With isolation 1055, block 1000 can be used in combination with another block (not shown) and so on, in an efficient and flexible layout. By positioning the power buses and isolation structures appropriately, the numbers of fins within a single block used for the upper devices and the number of fins within the same single block used for the lower devices can vary according to the needs of the circuits, and more efficient utilization of the finFET blocks can be realized for cell implementations.

Figure 11:
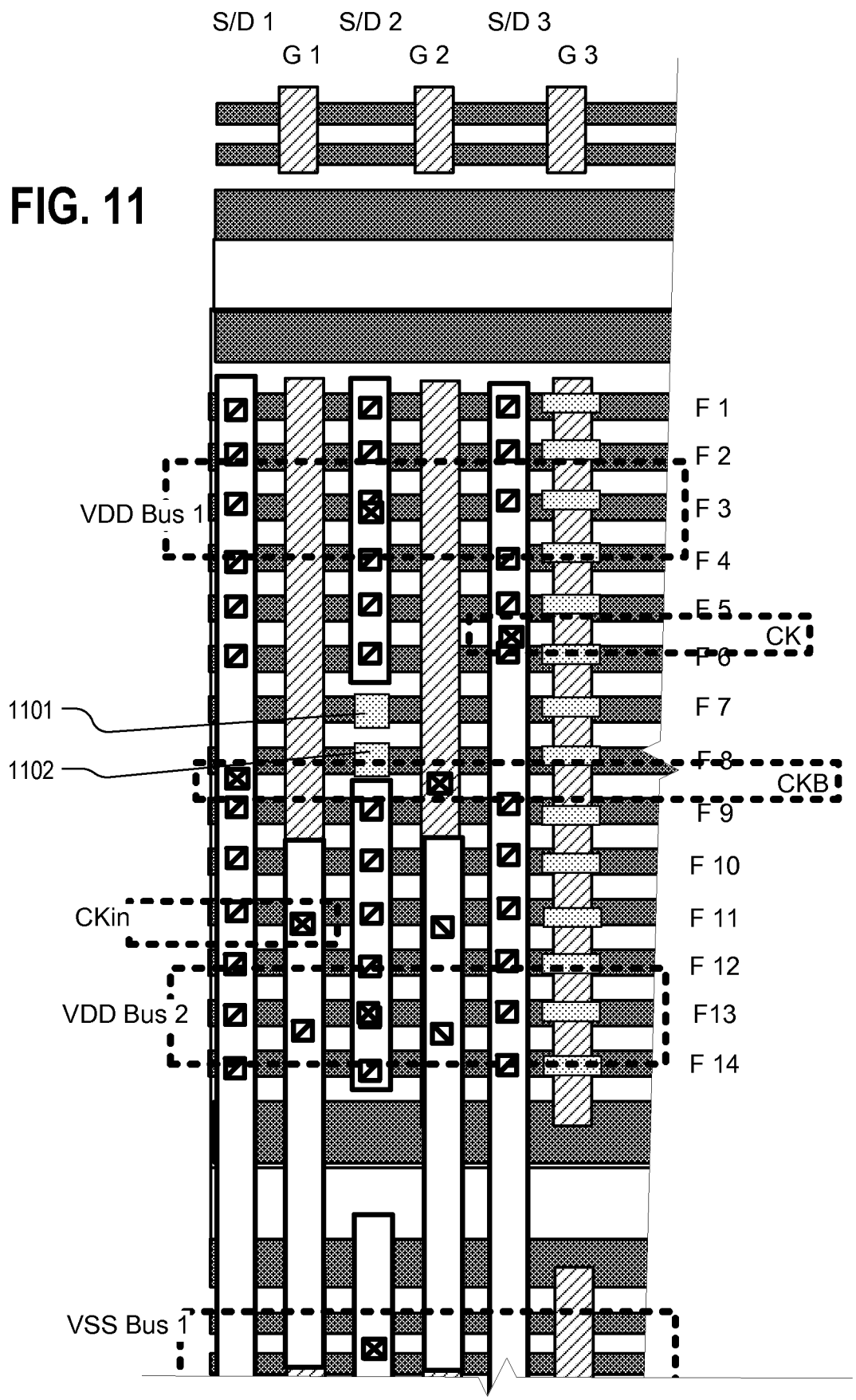
FIG. 11 illustrates implementation of components of a clock driver utilizing the finFET block architecture like that shown in FIG. 10.

FIG. 11 illustrates some of the flexibility possible using "tall" finFET blocks with multiple power buses over each block, including one or more power bus over inner fins in a given block. FIG. 11 uses the row and column notation introduced above in connection with FIGS. 8-9, having outer fins F1 and F14. The element implemented in FIG. 11 is the p-type component of a strong clock driver which could be used in a standard cell having four D flip-flops, similar to the clock driver shown in FIG. 9. The implementation shown in FIG. 9, however, utilizes four gate columns and five source/drain columns, while the implementation shown in FIG. 11 utilizes only two gate columns G1 and G2 and three source/drain columns S/D1 to S/D3. Also, the implementation shown in FIG. 11 makes more complete usage of the available fins.

In this example, a metal 2 trace over row F11 is coupled to the input clock CKin, and connected to the metal 1 trace over gate column G1, which is in turn coupled to the gate trace in column G1 over rows F1 through F 14, that extends over the isolation structure to the complementary n-type block. The source/drain terminals of column S/D1 in fins F1 to F6 and fins F9 to F14 are connected to a metal 1 trace over column S/D1, which is in turn coupled to a metal 2 trace between rows F8 and F9 which provides the inverted clock output CKB. The source/drain terminals in fins F1 to F6 in column S/D2 are connected to a metal 1 trace over column S/D2, which is in turn coupled to a metal 2 trace over row F3 acting as a first VDD power bus for the block. Also, source/drain terminals in fins F9 to F14 in column S/D2 are connected to a metal 1 trace over column S/D2, which is in turn coupled to a metal 2 trace over row F13 acting as a second VDD power bus for the block.

The metal 2 trace between rows F8 and F9 that carries the inverted clock output CKB is connected to the gate trace in column G2 extending over the fins in rows F1 to F14. A metal 1 trace in column G2 corresponds to the input to the second inverter in the driver, and is coupled to the gate trace in column G2, and extends across the isolation structure to the complementary finFET block. The source/drain terminals of column S/D3 in fins F1 to F6 and fins F9 to F14 are connected to a metal 1 trace over column S/D3, which is in turn coupled to a metal 2 trace between rows F5 and F6 which provides the buffered clock output CK. The fins in rows F7 and F8 are not utilized in this example. As a result, patterned insulating trenches, such as the trenches 1101, 1102, are implemented to cut the unused fins, and thereby isolate them from the circuits in a component. The pattern insulating trenches like trenches 1101, 1102 can be positioned in the layout as necessary to assist in dividing and isolating circuit elements.

Figure 12:
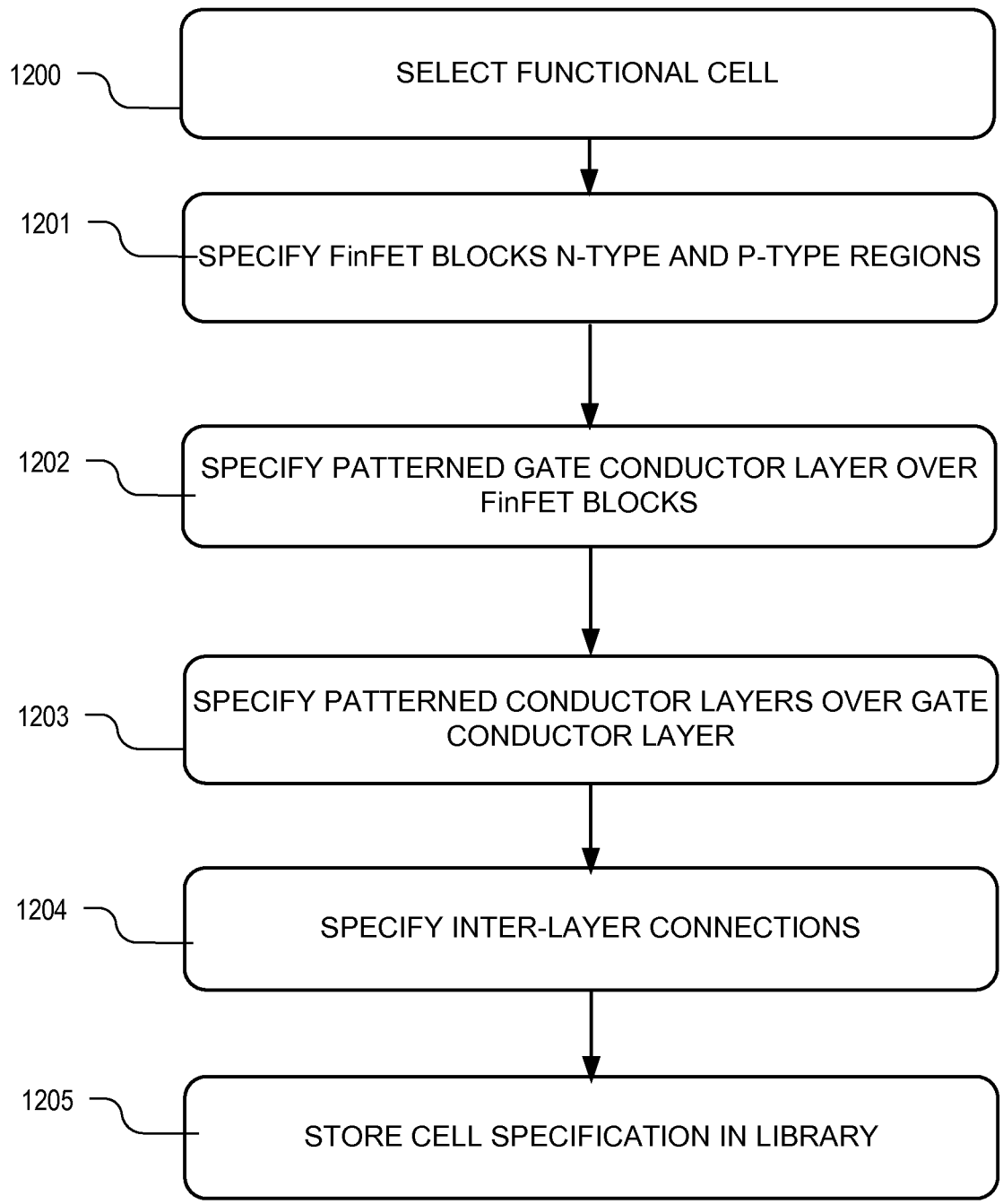
FIG. 12 is a simplified flow diagram of a process for designing a finFET block based cell for a cell library.

FIG. 12 is a simplified flow diagram of a process for designing a finFET block based cell for a cell library. The order of the steps can be modified as suits a particular designer. According to the simplified flow diagram, a functional cell to be included in a cell library is selected (1200). Such a cell can be a multibit flip-flop as described above, logic gates, logic blocks or other cell structures. Next, finFET blocks are specified, assuming CMOS technology, for n-type and p-type devices (1201). The finFET blocks include respective sets of semiconductor fins arranged in rows. The blocks are separated by isolation structures as discussed above. Then the patterned gate conductor layer is specified, to form gates in columns overlying the fins that will be used in the cell (1202). Then, the patterned conductor layers overlying the gate conductor layer are specified, to establish appropriate interconnections, preferably including a first layer having traces arranged in columns, and a second layer having traces arranged in row (1203). The plurality of patterned conductor layers include power traces, and can include more than one power trace over at least one of the finFET blocks. Then the interlayer connections are specified, to locate connections among the fins, the gate traces and the traces in the one or more patterned conductor layers (1204). The specifications produced in this method comprise layout files implemented in a GDS II format data base file representing the specified planar shapes of the elements, or other computer readable format. The specified cells are then stored in a cell library for use in integrated circuit design (1205).

Figure 13:
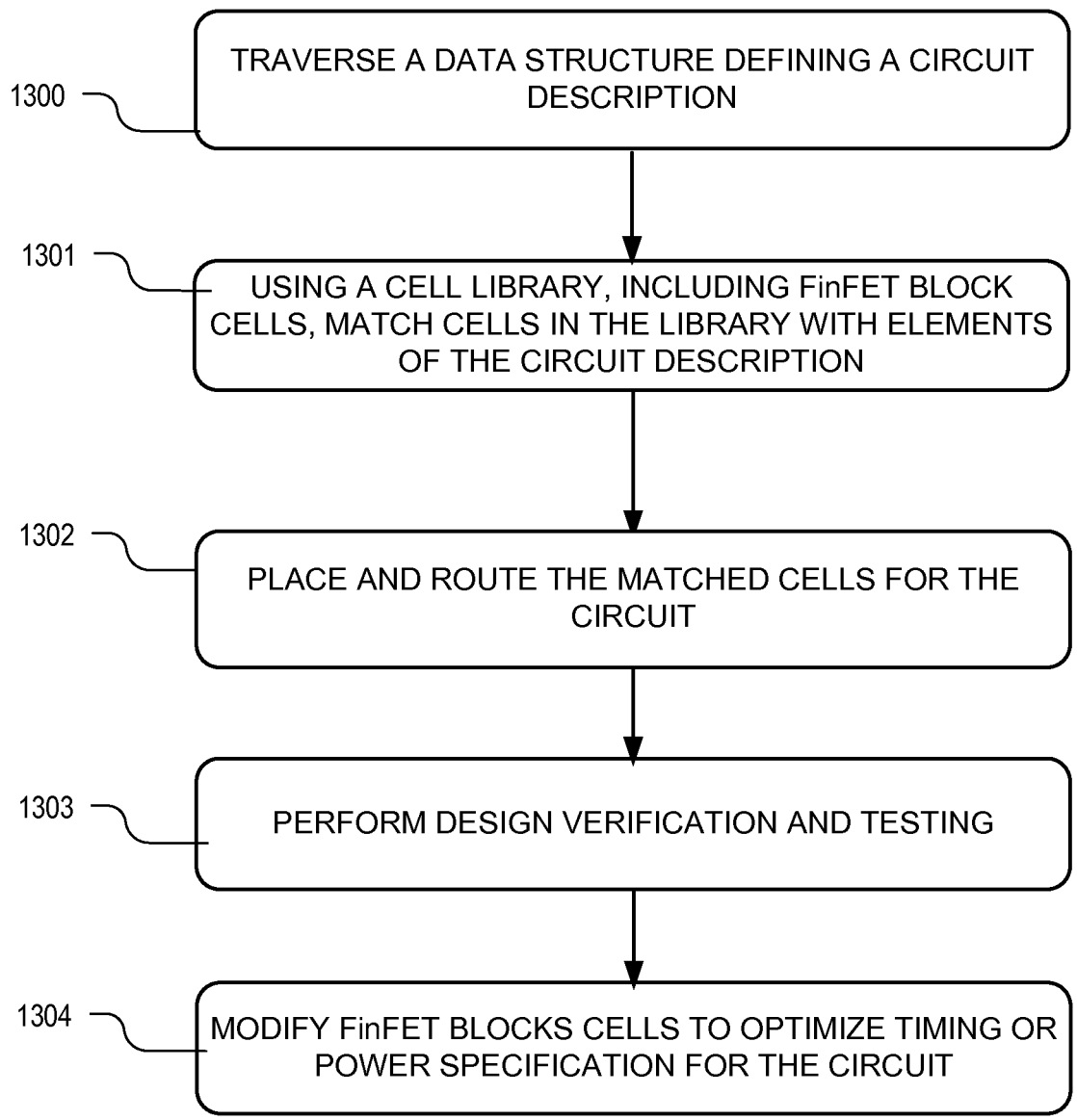
FIG. 13 is a simplified flow diagram for an automated design process utilizing a liquid cell library including finFET block-based cells as described herein.

FIG. 13 is a flowchart for a representative design automation process which can be implemented as logic executed by a system like that represented by FIG. 2, including a finFET block library having cells implementing using at least one "tall" finFET block with floating power buses as described herein. According to a first step of the process, a data structure that defines a circuit description is traversed in data processing system (1300). A cell library stored in a database or other computer readable medium coupled with the data processing system, that includes finFET block-based cells is described herein, is accessed by the data processing system, and utilized to matched cells in the library with the elements of the circuit description (1301). The matched cells are then placed and routed for an integrated circuit layout (1302). Next, design verification and testing is executed (1303). Finally, finFET block cells can be modified to optimize timing or power specifications for the circuit (1304). The modifications of the finFET block cells can comprise mask changes that result in changes to the traces in the first and second patterned conductor layers, and in the pattern of interlayer connectors, to change the number of fins utilized in a particular transistor. These changes can be accomplished without changing the area on the integrated circuit occupied by the cell.

Figure 14:
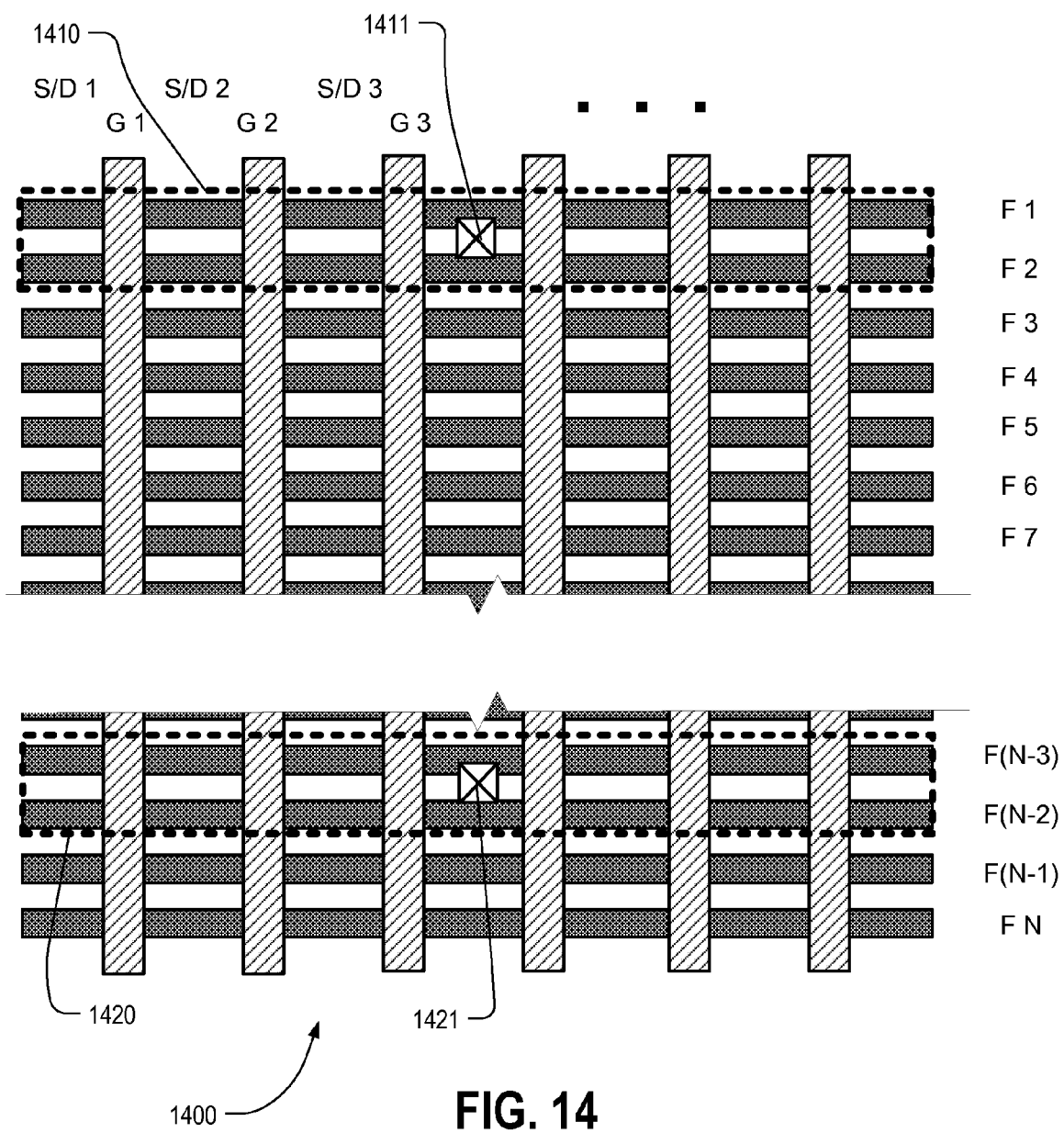
FIG. 14 is a diagram of a finFET block set out for the purposes of providing a frame of reference to specify locations of power traces over the block.

FIG. 14 is a drawing of a block 1400 that includes a set of fins and the gate traces, with power traces 1410 and 1420 overlying the fins. FIG. 14 uses the row and column notation introduced above in connection with FIGS. 8-9, having outer fins F1 and FN, and inner fins F2 to F(N−1). For the purposes of this description, the block 1400 can be said to have an area that corresponds with the outline of the set of fins, defined by the lengths of the fins in the horizontal dimension, and by the distance between the outside edges of the outer fins F1 and FN. The ability to place power traces in positions that overlie the fins of a block arises in part because embodiments of the flexible block architecture described utilize power traces that are not connected to the semiconductor body (or bodies)

within the area of the block. In other words, the power traces over the block do not include body ties within the area of the block.

The illustrated power traces 1410 and 1420 have rectangular shapes over the block. The power traces 1410 and 1420 are part of a power bus, and connected to continuing portions of the trace that are not over the block (i.e. outside the left and right sides of the block) and are not illustrated. The continuing traces can adopt any pattern necessary or suitable for the placement of the circuit, but are not considered parts of the power traces overlying the block for the purposes of this description, in order to provide a basis for defining a location of the power trace over the block. One can define the position of a power trace over or overlying a block by the position of a center of area over the block. Thus, the power trace 1410 over the block 1400 has a center of area at a position represented by the box 1411. The power trace 1420 over the block has a center of area at a position represented by the box 1421. As mentioned above, the power traces over the block may have more complex shapes than the simple rectangles represented in FIG. 14. However, one can characterize any two-dimensional shape by center of area, and define the location of the power trace overlying the block by the location of its center of area. In the illustration, it can be seen that the center of area 1411 of the power trace 1410 is located inside the outside edge of the outer fin F1. Thus, the power trace 1410 can be characterized as over the block. Also, one can characterize the position of the power trace with reference to its edges. Thus, the power trace 1420 has outer edge that is inside the outer edge along the side of the outer fin FN, and is likewise over the block. Embodiments of the flexible block architecture described herein can include power traces having more complex shapes which have outer edges inside the outer edges of the outer fins of the block, so that they do not extend across the sides of the block defined by the outer edges of the outer fins. Also, embodiments of the flexible block architecture described herein can have power traces such as the trace 1410, which has a center of area that is inside the outer edge of the outer fins of the block, while it outer edge may be outside the outer fin. It is advantageous to utilize power traces over the blocks that are essentially straight and elongated parallel with the fins in the block as shown in the figures herein, for the purposes of ease and uniformity of layout and design. The present technology enables the use of such power traces.

A finFET block architecture described above can be utilized to create a flexible library that comprises a plurality of finFET block-based cells. The finFET blocks in the library can have fine granularity with partial column usage across the cells.

The problem of bent or warped fins can be avoided using isolation structures as described herein.

Integrated circuits as described herein do not require bulk body ties to the power buses that overlie the finFET blocks at regular cell boundaries, or between n-type and p-type blocks, allowing full flexibility of power trace location overlying the fins of the finFET blocks, rather than in additional layout space adjacent the fins. In addition, a plurality of power buses can be implemented over a given finFET block.

The finFET blocks described herein can be arranged in a repeating pattern of n-type blocks and p-type blocks, allowing for flexible implementation of CMOS circuit elements utilizing complementary portions in blocks above and below a particular block, where at least a central block includes a plurality of power traces overlying the block.

The finFET block architecture described herein allows for very dense area utilization with flexible layout strategies. The technology can be especially suited for multiple bit flip-flops and sequential elements widely used in integrated circuit logic. In addition, the technology can be suited for implementation of gate arrays, field programmable gate arrays, "sea of gates" architectures and other high density and/or high performance integrated circuit structures.

The flexible layout in orthogonal pattern structures make the finFET blocks described herein ideal for implementing engineering change orders for size changes, or other modifications, during design verification processes during integrated circuit design and manufacturing.

The finFET block architecture described herein can be implemented with mixed block heights, so that standard finFET blocks can be mixed with "tall" finFET blocks, or variable sized blocks can be utilized, as suits the needs of a particular design goal. The finFET block architecture described herein enables utilization of a central block, such as a p-type finFET block, to implement a first set of complementary n-type and p-type devices using an upper n-type finFET block, and to implement a second set of complementary n-type and p-type devices using a lower n-type finFET.

In general, the creation of a finFET block-based flexible library is enabled using the finFET block architecture described herein. In such library, the standard cells can consist of "soft macros" that could be populated with some flexibility as to the exact location of their underlying elements. Unlike planar CMOS structures, where the granularity for modifications or adjustments of the cells is the whole transistor, in finFET block architectures as described herein, the granularity can be the fin. Designing finFET block structures using a subset of the fins arranged in parallel in a block provides for design flexibility.

Flexibility provided by the present design enables using power and ground buses anywhere over the region, and allows for optimizing the height of the finFET blocks by experimentation or other optimization techniques during cell design for the library, to improve layout and performance flexibility. A library can be comprised of a plurality of finFET block-based cells which exploit subsets of the available fins in the finFET blocks, leaving room for optimization procedures that do not alter the area of the layout. The library can be designed applying a minimum granularity to a single fin in the block for a gate trace along a column traversing a block of horizontal fins, rather than all of the fins in the block.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a substrate;
a first block including a first set of semiconductor fins in a first region of the substrate, the first block including outer fins on opposing outside edges of the first block, and inner fins between the outer fins, the first block being arranged for devices having channels with a first conductivity type;
a second block including a second set of semiconductor fins in a second region of the substrate, the second block including outer fins on opposing outside edges of the second block, and inner fins between the outer fins, the second block being arranged for devices having channels with a second conductivity type;

an inter-block insulator in a third region of the substrate between outer fins of the first and second blocks;

a patterned gate conductor layer including a first plurality of gate traces in the first block extending across the first set of semiconductor fins in the first block without crossing the inter-block insulator, and a second plurality of gate traces in the second block extending across the second set of semiconductor fins in the second block without crossing the inter-block insulator;

at least one patterned conductor layer in a level above the gate conductor layer, including an inter-block trace crossing over the inter-block insulator, and arranged to connect a gate trace in the first plurality of gate traces to a gate trace in the second plurality of gate traces; and a plurality of inter-layer connectors that connect semiconductor fins, gate traces, the inter-block trace and traces in the at least one patterned conductor layer.

2. The integrated circuit of claim 1, wherein the inter-block insulator comprises one or more insulator filled trenches, and is arranged in parallel with the outer fins of the first and second blocks.

3. The integrated circuit of claim 1, wherein the inter-block insulator comprises a first insulator filled trench adjacent the outer fin of the first block, a second insulator filled trench adjacent the outer fin of the second block, and a third insulation filled trench between the first and second insulator filled trenches.

4. The integrated circuit of claim 1, wherein the semiconductor fins in the first and second sets are separated by insulator filled trenches having a first depth in the substrate, and the inter-block insulator comprises an insulator filled trench having a depth in the substrate greater than the first depth.

5. The integrated circuit of claim 1, wherein the semiconductor fins in the first and second sets are separated by insulator filled trenches having a first depth in the substrate, and the inter-block insulator comprises a first insulator filled trench adjacent the outer fin of the first block, a second insulator filled trench adjacent the outer fin of the second block, and a third insulation filled trench between the first and second insulator filled trenches, the third insulator filled trench having a depth in the substrate greater than the first depth.

6. The integrated circuit of claim 1, wherein the inter-block insulator comprises means for balancing stress on the outer fins of the first and second blocks with stress due to structures between the outer fins and the inner fins of the corresponding first and second sets of semiconductor fins.

7. The integrated circuit of claim 1, wherein the semiconductor fins in the first and second sets include channels beneath gate traces in the plurality of gate traces, and source/drain terminals between gate traces in the plurality of gate traces, and wherein the at least one patterned conductor layer and the plurality of inter-layer connectors are arranged to connect one or more of the source/drain terminals in the first block to one or more of the source/drain terminals in the second block.

8. The integrated circuit of claim 1, including one or more power traces overlying each of the first and second blocks.

9. The integrated circuit of claim 8, wherein the plurality of gate traces in the first and second blocks are arranged in columns, and traces in the at least one patterned conductor layer are arranged to connect one of the power traces overlying the second block to a semiconductor fin in the second set of semiconductor fins in the second block acting as a terminal of a first device having a gate in a first gate trace in a particular column, and to connect another of the one or more power traces overlying the second block to another semiconductor fin in the second set of semiconductor fins in the second block acting as a terminal of a second device, the second device having a gate in a second gate trace in said particular column.

10. The integrated circuit of claim 8, wherein the at least one patterned conductor layer includes a first patterned conductor layer over the pattern gate conductor layer, and a second patterned conductor layer over the first patterned conductor layer, and wherein the one or more power traces overlying each of the first and second blocks comprise portions of the second patterned conductor layer.

11. The integrated circuit of claim 8, wherein the semiconductor fins in the first and second sets are arranged in parallel, the gate traces in the plurality of gate traces are orthogonal to the semiconductor fins, the inter-block trace is parallel to the gate traces, and the one or more power traces overlying the first and second blocks are parallel with the semiconductor fins.

12. The integrated circuit of claim 8, wherein the first and second sets of semiconductor fins include a semiconductor body or bodies in the first and second blocks, and wherein the one or more power traces overlying the first and second blocks are not connected to the semiconductor body or bodies within the corresponding blocks.

13. A method for manufacturing a cell library, comprising: specifying a base structure comprising:
a first block including a first set of semiconductor fins in a first region of the substrate, the first block including outer fins on opposing outside edges of the first block, and inner fins between the outer fins, the first block being arranged for devices having channels with a first conductivity type;
a second block including a second set of semiconductor fins in a second region of the substrate, the second block including outer fins on opposing outside edges of the second block, and inner fins between the outer fins, the second block being arranged for devices having channels with a second conductivity type;
an inter-block insulator in a third region of the substrate between outer fins of the first and second blocks;
specifying a cell on the base structure, the cell comprising elements of:
a patterned gate conductor layer including a first plurality of gate traces in the first block extending across the first set of semiconductor fins in the first block without crossing the inter-block insulator, and a second plurality of gate traces in the second block extending across the second set of semiconductor fins in the second block without crossing the inter-block insulator;
at least one patterned conductor layer in a level above the gate conductor layer, including an inter-block trace crossing over the inter-block insulator, and arranged to connect a gate trace in the first plurality of gate traces to a gate trace in the second plurality of gate traces;
a plurality of inter-layer connectors that connect semiconductor fins, gate traces, the inter-block trace and traces in the at least one patterned conductor layer; and
storing machine readable specifications of the cell in a cell library that is stored in a non-transitory computer readable medium.

14. The method of claim 13, wherein the inter-block insulator comprises one or more insulator filled trenches, and is arranged in parallel with the outer fins of the first and second blocks.

15. The method of claim 13, wherein the inter-block insulator comprises a first insulator filled trench adjacent the outer fin of the first block, a second insulator filled trench adjacent the outer fin of the second block, and a third insulation filled trench between the first and second insulator filled trenches.

16. The method of claim 13, wherein the semiconductor fins in the first and second sets are separated by insulator filled trenches having a first depth in the substrate, and the inter-block insulator comprises an insulator filled trench having a depth in the substrate greater than the first depth.

17. The method of claim 13, wherein the semiconductor fins in the first and second sets are separated by insulator filled trenches having a first depth in the substrate, and the inter-block insulator comprises a first insulator filled trench adjacent the outer fin of the first block, a second insulator filled trench adjacent the outer fin of the second block, and a third insulation filled trench between the first and second insulator filled trenches, the third insulator filled trench having a depth in the substrate greater than the first depth.

18. The method of claim 13, wherein the inter-block insulator comprises means for balancing stress on the outer fins of the first and second blocks with stress due to structures between the outer fins and the inner fins of the corresponding first and second sets of semiconductor fins.

19. The method of claim 13, wherein the semiconductor fins in the first and second sets include channels beneath gate traces in the plurality of gate traces, and source/drain terminals between gate traces in the plurality of gate traces, and wherein the at least one patterned conductor layer and the plurality of inter-layer connectors are arranged to connect one or more of the source/drain terminals in the first block to one or more of the source/drain terminals in the second block.

20. The method of claim 13, wherein the base structure comprises one or more power traces overlying each of the first and second blocks.

21. The method of claim 20, wherein the plurality of gate traces in the first and second blocks are arranged in columns, and traces in the at least one patterned conductor layer are arranged to connect one of the power traces overlying the second block to a semiconductor fin in the second set of semiconductor fins in the second block acting as a terminal of a first device having a gate in a first gate trace in a particular column, and to connect another of the one or more power traces overlying the second block to another semiconductor fin in the second set of semiconductor fins in the second block acting as a terminal of a second device, the second device having a gate in a second gate trace in said particular column.

22. The method of claim 20, wherein the at least one patterned conductor layer includes a first patterned conductor layer over the patterned gate conductor layer, and a second patterned conductor layer over the first patterned conductor layer, and wherein the one or more power traces overlying each of the first and second blocks comprise portions of the second patterned conductor layer.

23. The method of claim 20, wherein the semiconductor fins in the first and second sets are arranged in parallel, the gate traces in the plurality of gate traces are orthogonal to the semiconductor fins, the inter-block trace is parallel to the gate traces, and the one or more power traces overlying the first and second blocks are parallel with the semiconductor fins.

24. The method of claim 20, wherein the first and second sets of semiconductor fins include a semiconductor body or bodies in the first and second blocks, and wherein the one or more power traces overlying the first and second blocks are not connected to the semiconductor body or bodies within the corresponding blocks.

25. A data processing system adapted to process a computer implemented representation of a circuit design, comprising:
 a data processor and memory coupled to the data processor, the memory storing instructions executable by the data processor, including instructions to match cells specified in a machine readable circuit description with cells in a cell library, the cell library including a plurality of cells having a base structure comprising:
  a first block including a first set of semiconductor fins in a first region of the substrate, the first block including outer fins on opposing outside edges of the first block, and inner fins between the outer fins, the first block being arranged for devices having channels with a first conductivity type;
  a second block including a second set of semiconductor fins in a second region of the substrate, the second block including outer fins on opposing outside edges of the second block, and inner fins between the outer fins, the second block being arranged for devices having channels with a second conductivity type;
  an inter-block insulator in a third region of the substrate between outer fins of the first and second blocks;
 a cell in the plurality of cells including:
  a patterned gate conductor layer including a first plurality of gate traces in the first block extending across the first set of semiconductor fins in the first block without crossing the inter-block insulator, and a second plurality of gate traces in the second block extending across the second set of semiconductor fins in the second block without crossing the inter-block insulator;
  at least one patterned conductor layer in a level above the gate conductor layer, including an inter-block trace crossing over the inter-block insulator, and arranged to connect a gate trace in the first plurality of gate traces to a gate trace in the second plurality of gate traces; and
  a plurality of inter-layer connectors that connect semiconductor fins, gate traces, the inter-block trace and traces in the at least one patterned conductor layer.

26. The system of claim 25, wherein the inter-block insulator comprises one or more insulator filled trenches, and is arranged in parallel with the outer fins of the first and second blocks.

27. The system of claim 25, wherein the inter-block insulator comprises a first insulator filled trench adjacent the outer fin of the first block, a second insulator filled trench adjacent the outer fin of the second block, and a third insulation filled trench between the first and second insulator filled trenches.

28. The system of claim 25, wherein the semiconductor fins in the first and second sets are separated by insulator filled trenches having a first depth in the substrate, and the inter-block insulator comprises an insulator filled trench having a depth in the substrate greater than the first depth.

29. The system of claim 25, wherein the semiconductor fins in the first and second sets are separated by insulator filled trenches having a first depth in the substrate, and the inter-block insulator comprises a first insulator filled trench adjacent the outer fin of the first block, a second insulator filled trench adjacent the outer fin of the second block, and a third insulation filled trench between the first and second insulator filled trenches, the third insulator filled trench having a depth in the substrate greater than the first depth.

30. The system of claim 25, wherein the inter-block insulator comprises means for balancing stress on the outer fins of the first and second blocks with stress due to structures between the outer fins and the inner fins of the corresponding first and second sets of semiconductor fins.

31. The system of claim 25, wherein the first and second sets of semiconductor fins include channels beneath gate traces in the plurality of gate traces, and source/drain terminals between gate traces in the plurality of gate traces, and wherein the at least one patterned conductor layer and the plurality of inter-layer connectors are arranged to connect one or more of the source/drain terminals in the first block to one or more of the source/drain terminals in the second block.

32. The system of claim 25, wherein the base structure comprises one or more power traces overlying each of the first and second blocks.

33. The system of claim 32, wherein the plurality of gate traces in the first and second blocks are arranged in columns, and traces in the at least one patterned conductor layer are arranged to connect one of the power traces overlying the second block to a semiconductor fin in the second set of semiconductor fins in the second block acting as a terminal of a first device having a gate in a first gate trace in a particular column, and to connect another of the one or more power traces overlying the second block to another semiconductor fin in the second set of semiconductor fins in the second block acting as a terminal of a second device, the second device having a gate in a second gate trace in said particular column.

34. The system of claim 32, wherein the at least one patterned conductor layer includes a first patterned conductor layer over the patterned gate conductor layer, and a second patterned conductor layer over the first patterned conductor layer, and wherein the one or more power traces overlying each of the first and second blocks comprise portions of the second patterned conductor layer.

35. The system of claim 32, wherein the semiconductor fins in the first and second sets are arranged in parallel, the gate traces in the plurality of gate traces are orthogonal to the semiconductor fins, the inter-block trace is parallel to the gate traces, and the one or more power traces overlying the first and second blocks are parallel with the semiconductor fins.

36. The system of claim 32, wherein the first and second sets of semiconductor fins include a semiconductor body or bodies in the first and second blocks, and wherein the one or more power traces overlying the first and second blocks are not connected to the semiconductor body or bodies within the corresponding blocks.

37. An article of manufacture, comprising:
a memory readable by a data processor, the memory storing the cell library including a plurality of cells, at least one cell having a base structure comprising:
  a first block including a first set of semiconductor fins in a first region of the substrate, the first block including outer fins on opposing outside edges of the first block, and inner fins between the outer fins, the first block being arranged for devices having channels with a first conductivity type;
  a second block including a second set of semiconductor fins in a second region of the substrate, the second block including outer fins on opposing outside edges of the second block, and inner fins between the outer fins, the second block being arranged for devices having channels with a second conductivity type;
  an inter-block insulator in a third region of the substrate between outer fins of the first and second blocks;
the at least one cell including:
  a patterned gate conductor layer including a first plurality of gate traces in the first block extending across the first set of semiconductor fins in the first block without crossing the inter-block insulator, and a second plurality of gate traces in the second block extending across the second set of semiconductor fins in the second block without crossing the inter-block insulator;
  at least one patterned conductor layer in a level above the gate conductor layer, including a inter-block trace crossing over the inter-block insulator, and arranged to connect a gate trace in the first plurality of gate traces to a gate trace in the second plurality of gate traces; and
  a plurality of inter-layer connectors that connect semiconductor fins, gate traces, the inter-block trace and traces in the at least one patterned conductor layer.

* * * * *